United States Patent
Bian et al.

(10) Patent No.: US 10,627,946 B2
(45) Date of Patent: Apr. 21, 2020

(54) DISPLAY PANEL AND DISPLAY DEVICE

(71) Applicant: Shanghai Tianma Micro-Electronics Co., Ltd., Shanghai (CN)

(72) Inventors: Huafeng Bian, Shanghai (CN); Yan Shen, Shanghai (CN); Xuan Lu, Shanghai (CN); Feng Lu, Shanghai (CN); Liang Liu, Shanghai (CN); Qijun Yao, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 179 days.

(21) Appl. No.: 15/723,569

(22) Filed: Oct. 3, 2017

(65) Prior Publication Data

US 2019/0004659 A1     Jan. 3, 2019

(30) Foreign Application Priority Data

Jun. 30, 2017    (CN) .......................... 2017 1 0523127

(51) Int. Cl.
*G06F 3/041* (2006.01)
*G02F 1/1333* (2006.01)
(Continued)

(52) U.S. Cl.
CPC ............ *G06F 3/0414* (2013.01); *G06F 3/041* (2013.01); *G06F 3/0416* (2013.01);
(Continued)

(58) Field of Classification Search
CPC ...... G06F 3/0414; G06F 3/041; G06F 3/0416; G06F 2203/04105; G06F 3/0412;
(Continued)

(56) References Cited

U.S. PATENT DOCUMENTS 3,772,628 A * 11/1973 Underwood .......... G01L 9/0054
    338/4
4,104,605 A * 8/1978 Boudreaux .............. G01B 7/18
    204/192.1
(Continued)

FOREIGN PATENT DOCUMENTS

CN          105117072 A    12/2015
CN          106648236 A     5/2017

*Primary Examiner* — Jose R Soto Lopez
(74) *Attorney, Agent, or Firm* — Kilpatrick Townsend & Stockton, LLP

(57) ABSTRACT

Disclosed are a display panel and a display device. The display panel comprises a first substrate comprising a display region and a non-display region; a second substrate opposite to the first substrate; and a pressure sensor located on one side of the first substrate adjacent to the second substrate and located within the non-display region. The first and second substrates are adhered via a sealant, an orthogonal projection of the sealant on the first substrate is located within the non-display region of the first substrate, a distance from a midline of the sealant to a common boundary between the display region and the non-display region is larger than a distance from a geometric center of the pressure sensor to the common boundary between the display region and the non-display region. The midline of the sealant is a perpendicular bisector of a common perpendicular of the two edges of the sealant.

9 Claims, 20 Drawing Sheets

(51) Int. Cl.
  *G02F 1/1339* (2006.01)
  *H01L 51/52* (2006.01)
  *H01L 27/32* (2006.01)
  *G02F 1/1362* (2006.01)
  *G02F 1/1335* (2006.01)
(52) U.S. Cl.
  CPC ........ *G02F 1/1339* (2013.01); *G02F 1/13338* (2013.01); *G02F 1/133514* (2013.01); *G02F 1/136286* (2013.01); *G06F 2203/04105* (2013.01); *H01L 27/323* (2013.01); *H01L 27/3276* (2013.01); *H01L 51/5246* (2013.01)
(58) Field of Classification Search
  CPC ........ G02F 1/133514; G02F 1/136286; G02F 1/1339; G02F 1/13338; H01L 27/3276; H01L 27/323; H01L 51/5246
  See application file for complete search history.

(56) References Cited

U.S. PATENT DOCUMENTS

| | | | | |
|---|---|---|---|---|
| 4,918,262 | A * | 4/1990 | Flowers | G06F 3/0418 345/173 |
| 5,241,308 | A * | 8/1993 | Young | G06F 3/0414 341/22 |
| 6,739,199 | B1 * | 5/2004 | Nikkel | B41J 2/14153 73/777 |
| 8,135,244 | B1 * | 3/2012 | Sander | G01L 1/242 250/227.18 |
| 8,913,031 | B2 * | 12/2014 | Honda | G06F 3/044 178/18.06 |
| 9,690,413 | B2 * | 6/2017 | Filiz | G01L 1/18 |
| 10,043,605 | B2 * | 8/2018 | Ng | G01L 1/18 |
| 2003/0150276 | A1 * | 8/2003 | Christensen | G01G 3/12 73/795 |
| 2005/0068608 | A1 * | 3/2005 | Campbell | B81C 1/00595 359/291 |
| 2005/0150280 | A1 * | 7/2005 | Tang | B82Y 35/00 73/105 |
| 2005/0221202 | A1 * | 10/2005 | Gofron | B82Y 10/00 430/5 |
| 2006/0043508 | A1 * | 3/2006 | Ohta | G01L 1/18 257/417 |
| 2006/0179958 | A1 * | 8/2006 | Ohta | G01L 1/18 73/862.045 |
| 2007/0278420 | A1 * | 12/2007 | Molhave | B25J 7/00 250/442.11 |
| 2007/0279180 | A1 * | 12/2007 | Sugimoto | G01B 7/18 338/2 |
| 2009/0015564 | A1 * | 1/2009 | Ye | G06F 3/0414 345/173 |
| 2009/0205443 | A1 * | 8/2009 | Takeuchi | G01B 7/18 73/862.322 |
| 2010/0123686 | A1 * | 5/2010 | Klinghult | G06F 3/0412 345/178 |
| 2011/0023630 | A1 * | 2/2011 | Zandman | G01B 7/18 73/862.623 |
| 2011/0107838 | A1 * | 5/2011 | Suijlen | G01L 9/0019 73/702 |
| 2011/0199284 | A1 * | 8/2011 | Davis | G02B 26/0833 345/31 |
| 2011/0205074 | A1 * | 8/2011 | Feng | A61M 5/1414 340/613 |
| 2011/0227569 | A1 * | 9/2011 | Cai | B82Y 25/00 324/252 |
| 2011/0304325 | A1 * | 12/2011 | Walther | G01R 33/022 324/209 |
| 2013/0047747 | A1 * | 2/2013 | Joung | G01L 1/142 73/862.68 |
| 2013/0133433 | A1 * | 5/2013 | Yoshikawa | G01L 1/18 73/774 |
| 2013/0215056 | A1 * | 8/2013 | Johansson | G01R 27/14 345/173 |
| 2013/0222306 | A1 * | 8/2013 | Aberg | G06F 1/206 345/173 |
| 2013/0334311 | A1 * | 12/2013 | Pant | G06K 7/082 235/449 |
| 2014/0098028 | A1 * | 4/2014 | Kwak | G09G 5/00 345/173 |
| 2014/0174190 | A1 * | 6/2014 | Kulkarni | G01L 1/2287 73/774 |
| 2014/0234552 | A1 * | 8/2014 | Frankenberger | H05K 3/222 427/555 |
| 2014/0283618 | A1 * | 9/2014 | Yasumoto | G01L 1/2293 73/777 |
| 2015/0020610 | A1 * | 1/2015 | Hurst | G01L 1/146 73/862.68 |
| 2015/0169100 | A1 * | 6/2015 | Tsuyuki | G06F 1/1656 345/173 |
| 2015/0185476 | A1 * | 7/2015 | Lee | G02B 27/017 345/8 |
| 2015/0192481 | A1 * | 7/2015 | Nguyen | G01L 1/22 345/206 |
| 2015/0241291 | A1 * | 8/2015 | Riou | G01L 9/0019 73/702 |
| 2015/0296607 | A1 * | 10/2015 | Yang | G01L 1/205 361/750 |
| 2015/0338294 | A1 * | 11/2015 | Watson | G01L 1/2287 73/774 |
| 2016/0048266 | A1 * | 2/2016 | Smith | G06F 3/0418 345/174 |
| 2016/0103544 | A1 * | 4/2016 | Filiz | G06F 3/0414 345/174 |
| 2016/0129483 | A1 * | 5/2016 | Sung | B08B 1/001 134/6 |
| 2016/0209199 | A1 * | 7/2016 | Sumant | H01L 29/04 |
| 2016/0328065 | A1 * | 11/2016 | Johnson | G06F 3/03545 |
| 2017/0016930 | A1 * | 1/2017 | Qiu | G01P 15/0802 |
| 2017/0038879 | A1 * | 2/2017 | Hsiao | G06F 3/0414 |
| 2017/0059360 | A1 * | 3/2017 | Zimmer | G01D 5/16 |
| 2017/0060189 | A1 * | 3/2017 | Sohn | G06F 1/1652 |
| 2017/0060283 | A1 * | 3/2017 | Sohn | G06F 3/041 |
| 2017/0090632 | A1 * | 3/2017 | Su | G06F 3/0412 |
| 2017/0115781 | A1 * | 4/2017 | Zeng | G06F 3/045 |
| 2017/0228093 | A1 * | 8/2017 | Li | G02F 1/13338 |
| 2017/0269756 | A1 * | 9/2017 | Wang | G06F 3/0414 |
| 2017/0357346 | A1 * | 12/2017 | Wang | G06F 3/044 |
| 2017/0364189 | A1 * | 12/2017 | Arola | G06F 3/044 |
| 2018/0031885 | A1 * | 2/2018 | Nakamori | G01L 1/146 |
| 2018/0052350 | A1 * | 2/2018 | Zhao | G06F 3/0412 |
| 2018/0059839 | A1 * | 3/2018 | Kim | H01L 51/5284 |
| 2018/0074638 | A1 * | 3/2018 | Chiang | G06F 3/0416 |
| 2018/0088736 | A1 * | 3/2018 | Jeong | G06F 3/0414 |
| 2018/0103899 | A1 * | 4/2018 | Cahan | A61B 5/0031 |
| 2018/0210601 | A1 * | 7/2018 | Chi | G06F 3/0414 |
| 2018/0239473 | A1 * | 8/2018 | Wang | G06F 3/0414 |
| 2018/0299983 | A1 * | 10/2018 | Liu | G06F 3/041 |
| 2018/0300012 | A1 * | 10/2018 | Lu | G06F 3/0416 |
| 2018/0329558 | A1 * | 11/2018 | Park | G06F 3/0414 |
| 2018/0348917 | A1 * | 12/2018 | Wang | G06F 3/046 |
| 2018/0356930 | A1 * | 12/2018 | Lu | G06F 3/0416 |
| 2018/0365466 | A1 * | 12/2018 | Shim | G06K 9/0004 |
| 2019/0121465 | A1 * | 4/2019 | Seo | G01L 9/0072 |
| 2019/0129557 | A1 * | 5/2019 | Liu | G06F 3/041 |

* cited by examiner

DISPLAY PANEL AND DISPLAY DEVICE

CROSS-REFERENCE TO RELATED APPLICATIONS

This application claims priority to Chinese Patent Application No. 201710523127.5, filed on Jun. 30, 2017 and entitled "DISPLAY PANEL AND DISPLAY DEVICE", the disclosure of which is incorporated herein by reference in its entirety.

TECHNICAL FIELD

The present disclosure relates to touch display technologies, and in particular, to a display panel and a display device.

BACKGROUND

At present, display panels integrated with a touch electrode are widely applied to electronic apparatuses such as mobile phones, tablet computers and information inquiry machines in public halls. As such, a user can operate on an electronic apparatus by only touching an icon on the electronic apparatus, and hence there is no need by the user on other input apparatuses (for example, a keyboard and a mouse, etc.) and human-machine interaction is made simpler and easier.

For better meeting user expectations, a pressure sensor for detecting the magnitude of the touch pressure by which a user touches a display panel is usually provided in a display panel to improve the application functionality of the touch technology.

SUMMARY

The present disclosure provides a display panel and a display device in order to improve the pressure detection performance of the display panel.

In a first aspect, the present disclosure provides a display panel, which comprises: a substrate, which includes a display region and a non-display region surrounding the display region; a second substrate, which is provided opposite to the first substrate; and a pressure which is located on one side of the first substrate that is adjacent to the second substrate and is located within the non-display region of the first substrate; wherein, the first substrate and the second substrate are adhered to each other via a sealant, an orthogonal projection of the sealant the first substrate is located within the non-display region of the first substrate, and a distance a midline of the sealant to a common boundary between the display region and the non-display region is larger than a distance from a geometric center of the pressure sensor to the common boundary between the display region and the non-display region, wherein the midline of the sealant is a perpendicular bisector of a common perpendicular of the two edges of the sealant.

In a second aspect, the present disclosure further provides a display device, which comprises any of the display panels according to the embodiments of the disclosure.

In the embodiments of the disclosure, the distance from a midline of the sealant to a common boundary between the display region and the non-display region is larger than the distance from a geometric center of the pressure sensor to the common boundary between the display region and the non-display region, so that the problem in the existing display panel that the pressure detection performance of the pressure sensor is not good due to the unreasonable relative locations of the sealant and the pressure sensor may be solved, thereby improving the pressure detection performance of the display panel.

DETAILED DESCRIPTION

The application will be illustrated in detail in conjunction with the drawings and embodiments. It may be understood that, the embodiments described here are only provided for explaining, rather than limiting, the application. Additionally, it further needs to be noted that, for convenient description, the drawings only show the parts related to the application, rather than the whole structure.

A sealant for adhering an array substrate to a color filter substrate is often further provided in an existing display panel. It is found by the inventors that, in the existing display panel, because the relative arrangement locations of the sealant and the pressure sensor are unreasonable, the pressure induction detection signal output by the pressure sensor is unstable, which will cause a bad pressure detection performance of the display panel. In view of this, the disclosure provides a display panel and a display device to improve the pressure detection performance of the display panel.

Figure 1A:
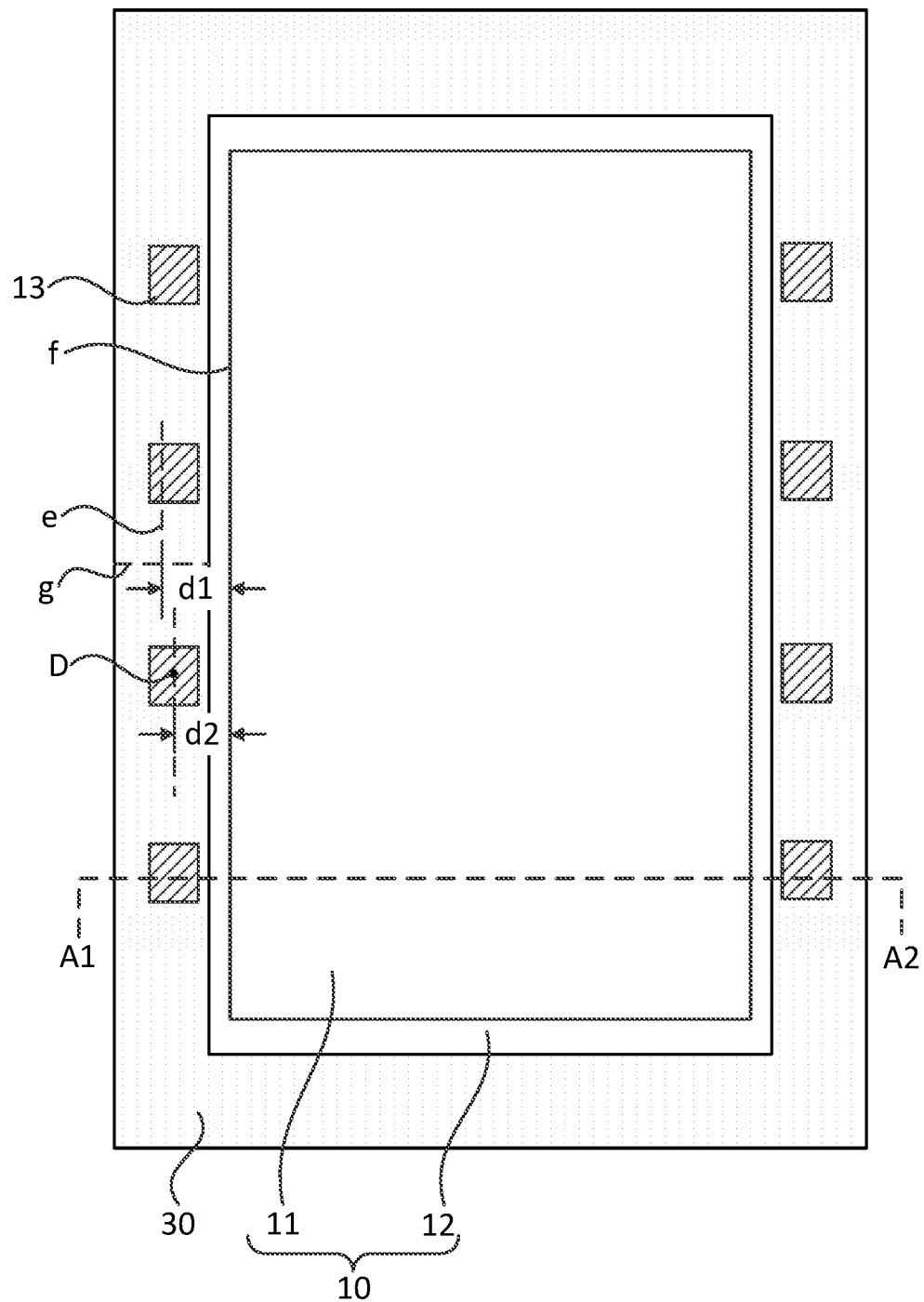
FIG. 1A is a structural representation of a display panel according to an embodiment of the disclosure.
Figure 1B:
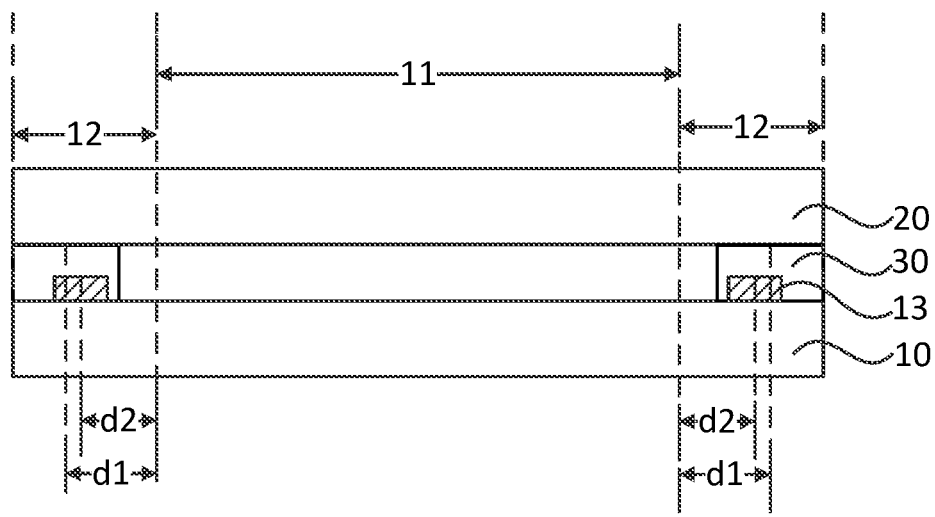
FIG. 1B is a schematic sectional view taken along A1-A2 in FIG. 1A.

FIG. 1A a structural representation of a display panel according to an embodiment of the disclosure, and FIG. 1B is a schematic sectional view taken along A1-A2 in FIG. 1A. Referring to FIG. 1A and FIG. 1B, the display panel includes: a first substrate 10, which includes a display region 11 and a non-display region 12 surrounding the display region 11; a second substrate 20, which is arranged opposite to the first substrate 10; and a pressure sensor 13, which is located on one side of the first substrate 10 that is adjacent to the second substrate 20 and is located in the non-display region 12 of the first substrate 10; wherein, the first substrate 10 and the second substrate 20 are adhered to each other via a sealant 30, the orthogonal projection of the sealant 30 on the first substrate 10 is located within the non-display region 12 of the first substrate 10, the distance d1 from the midline e of the sealant 30 to the common boundary f between the display region 11 and the non-display region 12 is larger than the distance d2 from the geometric center D of the pressure sensor 13 to the common boundary f between the display region 11 and the non-display region 12, wherein, the midline e of the sealant 30 is the perpendicular bisector of the common perpendicular g of the two edges of the sealant 30.

When a finger touches the display panel, both the first substrate 10 and the second substrate 20 of the display panel will be deformed, and a shear force will be generated at each of the locations at which the first substrate 10 and the second substrate 20 are deformed. Under the action of the shear force at the location of the first substrate 10 corresponding to a pressure sensor 13 (that is the orthogonal projection region of the pressure sensor 13 on the first substrate 10) and the shear force at the location of the second substrate 20 corresponding to the pressure sensor 13 (that is, the orthogonal projection region of the pressure sensor 13 on the second substrate 20), the impedance of the internal strain resistor in the pressure sensor 13 changes, so that the pressure induction detection signal output by the pressure sensor changes. The magnitude of the touch pressure actually input by a user may be obtained according to the pressure induction detection signal.

It is found that, because the first substrate 10 and the second substrate 20 are adhered to each other via a sealant 30. Based on the transitivity of force, the sealant 30 between the first substrate 10 and the second substrate 20 can function to transmit a force, thereby having an effect on supporting. In the region where the sealant 30 is provided, the nearer a location is to the midline e of the sealant 30, the stronger at the location the bonding force between the first substrate 10 and the second substrate 20 will be, and the stronger at the location the supporting effect of the sealant 30 will be; also, the nearer a location is to the edge of the sealant 30, the weaker at the location the bonding force between the first substrate 10 and the second substrate 20 will be, and the weaker at the location the supporting effect of the sealant 30 will be. Therefore, the nearer the location of the pressure sensor 13 is to the midline e of the sealant 30, the smaller the shear force at the location on the first substrate 10 corresponding to the pressure sensor 13 when pressing will be, and at the same time, the smaller the shear force at the location on the second substrate 20 corresponding to the pressure sensor 13 will be. The farther the location of the the pressure sensor 13 is from the midline e of the sealant 30, the larger the shear force on the first substrate 10 at the location corresponding to the pressure sensor 13 when pressing will be, and the larger the shear force on the second substrate 20 at the location corresponding to the pressure sensor 13 will be.

Therefore, in the embodiment of the disclosure, a distance from a midline of the sealant to a common boundary between the display region and the non-display region is larger than a distance from a geometric center of the pressure sensor to the common boundary between the display region and the non-display region, so that the problem that the pressure detection performance of the pressure sensor is not good due to the unreasonable relative locations of the sealant and the pressure sensor in the existing display panel may be solved, thereby improving the pressure detection performance of the display panel.

The display panel may be a liquid crystal display panel or an organic light-emitting display panel. If the display panel is a liquid crystal display panel, the first substrate 10 may be provided as an array substrate, and the second substrate 20 may be provided as a color filter substrate, or the first substrate 10 may be provided as a color filter substrate, and the second substrate 20 may be provided as an array substrate. If the display panel is an organic light-emitting display (OLED) panel, the first substrate 10 may be provided as an array substrate, and the second substrate 20 may be provided as a cover plate, or the first substrate 10 may be provided as a cover plate, and the second substrate 20 may be provided as an array substrate. In other words, if the display panel is a liquid crystal display panel, the pressure sensor 13 may be provided on the array substrate or may be provided on the color filter substrate. If the display panel is an OLED display panel, the pressure sensor 13 may be provided on the array substrate or may be provided on the cover plate. In consideration that a circuit structure for driving a liquid crystal to rotate (which corresponds to a liquid crystal display panel) or driving a light-emitting layer to emit light (which corresponds to an OLED display panel) will generally be provided on the array substrate, the pressure sensor 13 may be provided on the array substrate. The advantage of such an arrangement lies in that, the pressure sensor 13 and a signal line connected with the pressure sensor 13 may be formed, while forming a circuit structure for driving a liquid crystal to rotate or driving a light-emitting layer to emit light, and hence the manufacture process may be simplified. Additionally, a part of the signal lines in the circuit structure for driving a liquid crystal to rotate or driving a light-emitting layer to emit light may be further multiplexed as the signal line electrically connected with the pressure sensor 13 so as to transfer a bias voltage signal to the pressure sensor 13 or transfer a pressure induction detection signal output from the pressure sensor 13, thereby reducing the area of the arrangement region of the signal line connected with the pressure sensor 13 and alleviating the problem with respect to the insufficient area for wirings in the non-display region.

Figure 2A:
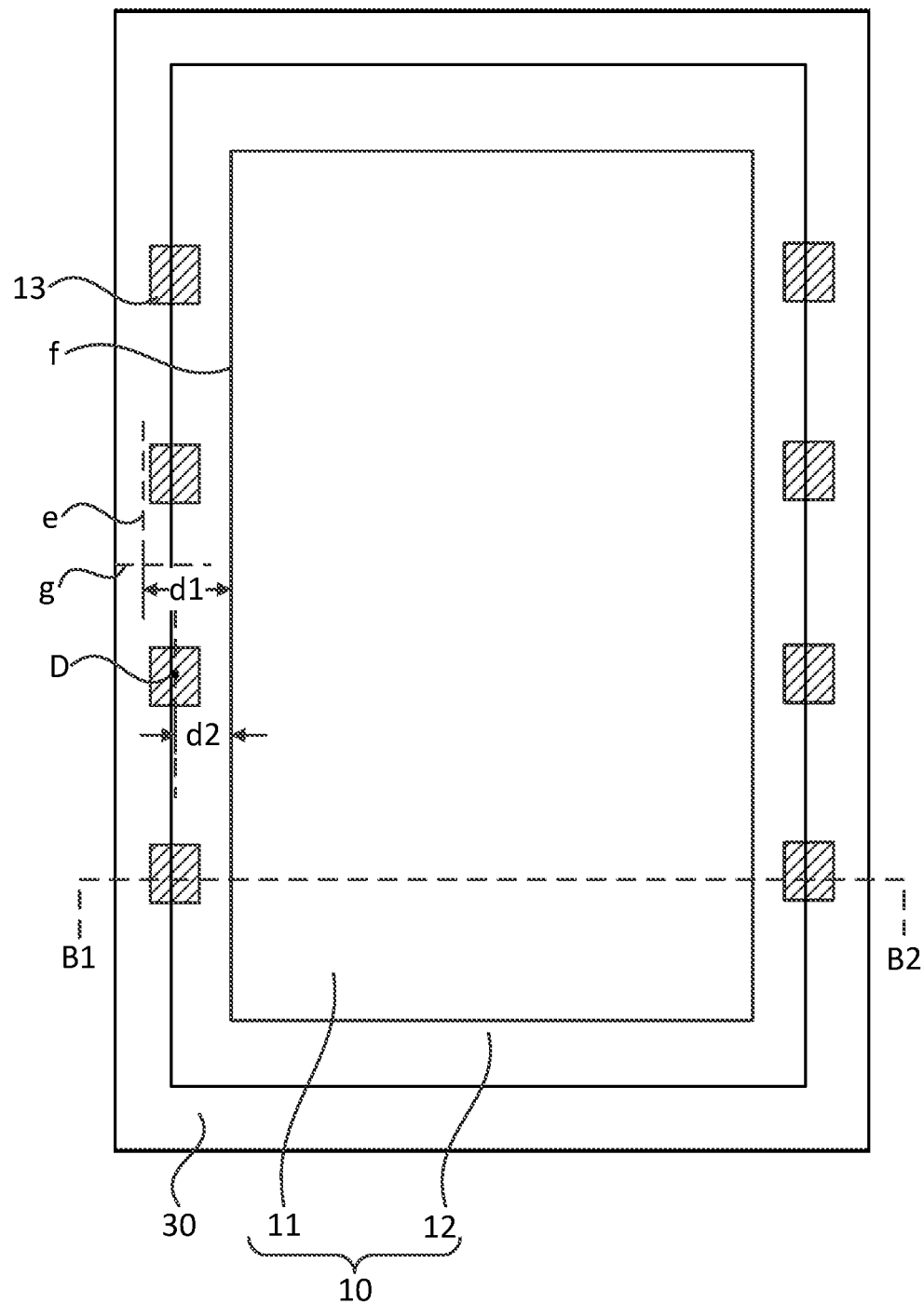
FIG. 2A is a structural representation of another display panel according to an embodiment of the disclosure.
Figure 2B:
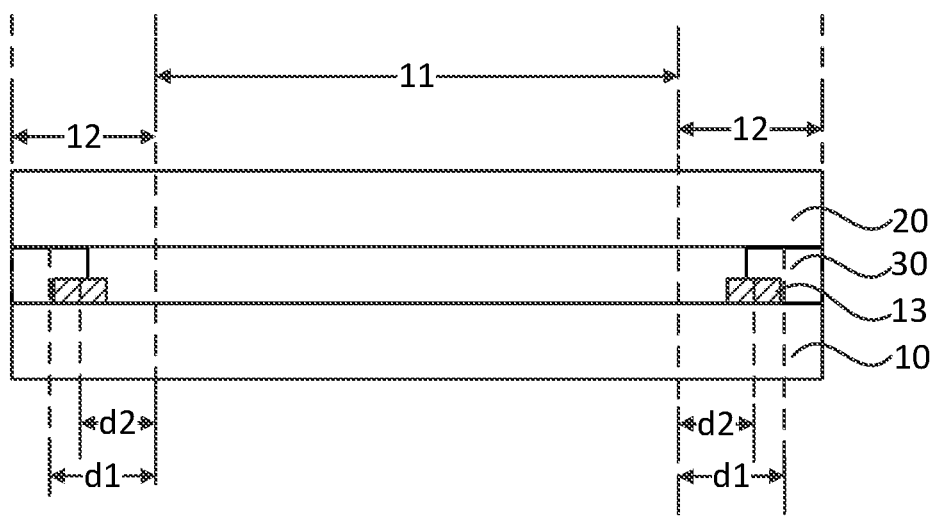
FIG. 2B is a schematic sectional view taken along B1-B2 in FIG. 2A.

FIG. 2A is a structural representation of a display panel according to an embodiment of the disclosure, and FIG. 2B is a schematic sectional view taken along B1-B2 in FIG. 2A. Referring to FIGS. 2A and 2B, the orthogonal projection of the sealant 30 on the first substrate 10 may be at least partially overlapped with the orthogonal projection of the pressure sensor 13 on the first substrate 10, that is, the sealant 30 covers at least a part of the region of the pressure sensor 13. The advantage of such an arrangement lies in that, the shear force at the location on the first substrate 10 corresponding to the pressure sensor 13 and the shear force at the location on the second substrate 20 corresponding to the pressure sensor 13 during pressing may be further increased, so that given the input bias voltage signal, the pressure induction detection signal output by the pressure sensor 13 may be increased, and hence the sensitivity of pressure detection may be improved, thereby improving the pressure detection performance of the display panel. Typically, the area of the pressure sensor 13 covered by the sealant 30 is less than or equal to one half of the total area of the pressure sensor 13 to ensure a high pressure detection performance of the display panel.

Figure 3A:
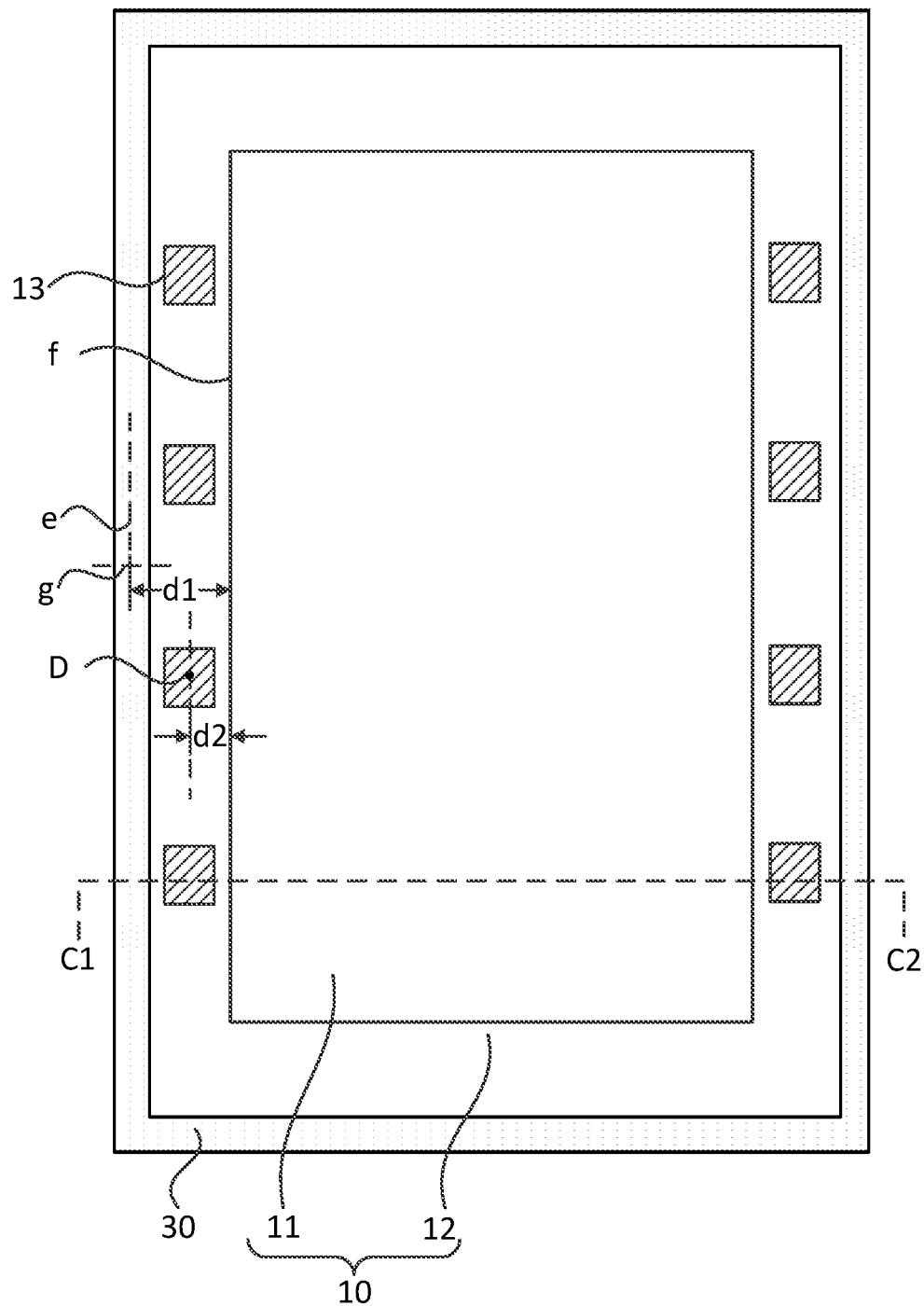
FIG. 3A is a structural representation of another display panel according to an embodiment of the disclosure.
Figure 3B:
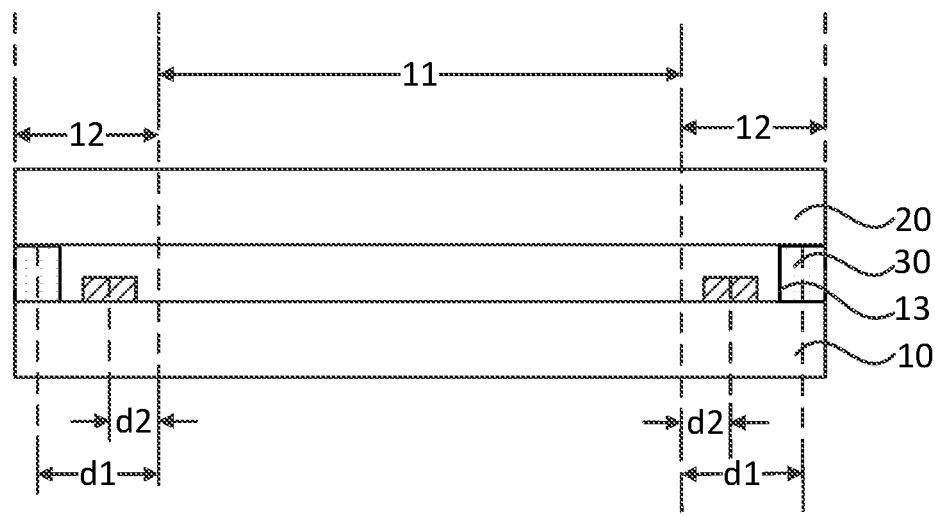
FIG. 3B is a schematic sectional view taken along C1-C2 in FIG. 3A.

FIG. 3A is a structural representation of a display panel according to an embodiment of the disclosure, and FIG. 3B is a schematic sectional view taken along C1-C2 in FIG. 3A. Referring to FIGS. 3A and 3B, the orthogonal projection of the sealant 30 on the first substrate 10 does not overlap with the orthogonal projection of the pressure sensor 13 on the first substrate 10. The advantage of such an arrangement lies in that, the shear force at the location on the first substrate 10 corresponding to the pressure sensor 13 and the shear force at the location on the second substrate 20 corresponding to the pressure sensor 13 during pressing may be further increased, so that given the input bias voltage signal, the pressure induction detection signal output by the pressure sensor 13 may be increased, and hence the sensitivity of pressure detection may be improved, thereby improving the pressure detection performance of the display panel.

In the above technical solution, there may be various specific structures of the pressure sensor 13 on the display panel, and illustration will be given below on the structure of a typical pressure sensor 13, but the disclosure is not limited hereto.

Figure 4:
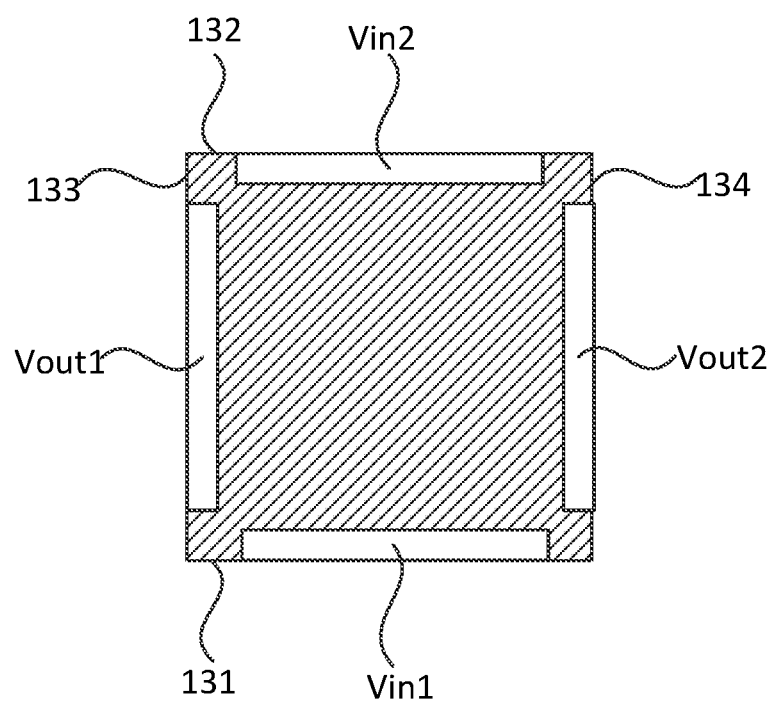
FIG. 4 is a structural representation of a pressure sensor according to an embodiment of the disclosure.

FIG. 4 is a structural representation of a pressure sensor according to an embodiment of the disclosure. Referring to FIG. 4, the pressure sensor is in a form of a quadrangle and is made of a semiconductor material. The pressure sensor includes a first edge 131 and a second edge 132 arranged opposite to each other, and a third edge 133 and a fourth edge 134 arranged opposite to each other; the pressure sensor includes a first power signal input terminal Vin1 located on the first edge 131 and a second power signal input terminal Vin2 located on the second edge 132, for inputting a bias voltage signal to the pressure sensor 13; the pressure sensor further includes a first induction signal measurement terminal Vout1 located on the third edge 133 and a second induction signal measurement terminal Vout2 located on the fourth edge 134, for outputting a pressure induction detection signal from the pressure sensor 13.

Figure 5:
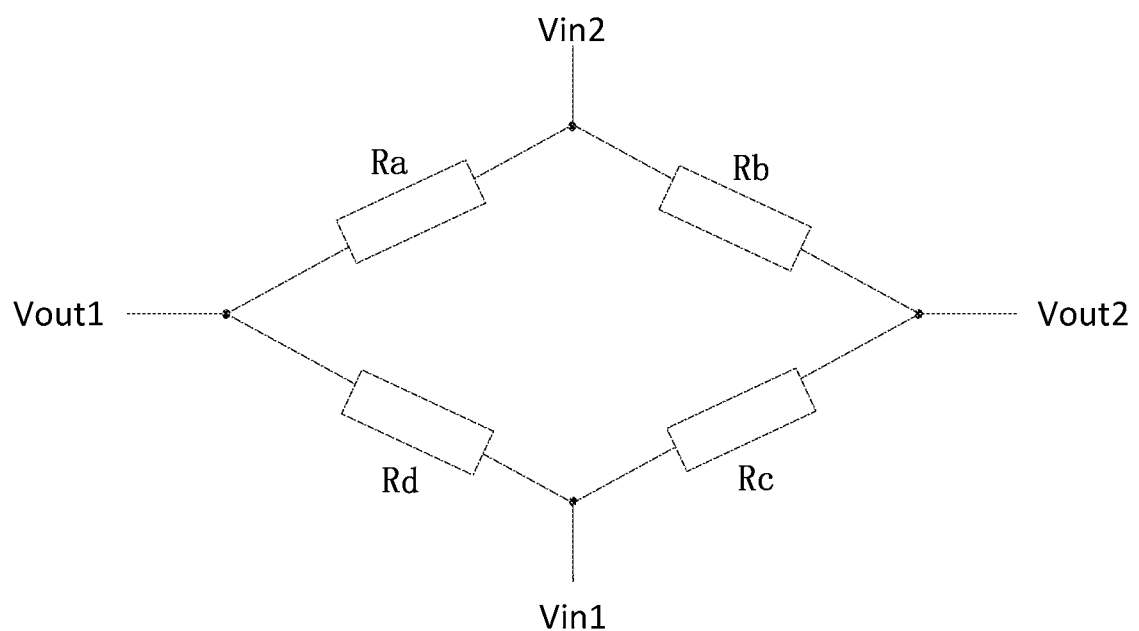
FIG. 5 is an equivalent circuit diagram of the pressure sensor in FIG. 4.

FIG. 5 is an equivalent circuit diagram of the pressure sensor in FIG. 4. Referring to FIG. 4 and FIG. 5, the pressure sensor may be equivalent to a Wheatstone bridge. The Wheatstone bridge includes four equivalent resistors, i.e., an equivalent resistor Ra, an equivalent resistor Rb, an equivalent resistor Rc and an equivalent resistor Rd respectively. The region between the second power signal input terminal Vin2 and the first induction signal measurement terminal Vout1 is arranged with the equivalent resistor Ra, the region in between the second power signal input terminal Vin2 and the second induction signal measurement terminal Vout2 is arranged with the equivalent resistor Rb, the region between the first power signal input terminal Vin1 and the first induction signal measurement terminal Vout1 is arranged with the equivalent resistor Rd, and the region between the first power signal input terminal Vin1 and the second induction signal measurement terminal Vout2 is arranged with the equivalent resistor Rc. When a bias voltage signal is input to the first power signal input terminal Vin1 and the second power signal input terminal Vin2, an electric current will pass through each of the branches in the Wheatstone bridge. At this time, when the display panel is pressed, under the action of a shear force on the display panel (including the first substrate 10 and the second substrate 20) at the location corresponding to the pressure sensor 13, the impedance of at least one of the equivalent resistor Ra, the equivalent resistor Rb, the equivalent resistor Rc and the equivalent resistor Rd inside the pressure sensor 13 will change, so that the pressure induction detection signal outputs by the first induction signal measurement terminal Vout1 and the second induction signal measurement terminal Vout2 of the pressure sensor 13 will be different from the pressure induction detection signals output by the first induction signal measurement terminal Vout1 and the second induction signal measurement terminal Vout2 of the pressure sensor 13 without being pressed, and hence the magnitude of the touch pressure may be determined.

In one embodiment, the shape of the pressure sensor 13 may be a square. The advantage of such an arrangement lies in that, it is favorable for making the resistance values of the equivalent resistor Ra, the equivalent resistor Rb, the equivalent resistor Rc and the equivalent resistor Rd equal to each other. In this way, without being pressed, the electric potentials of the first induction signal measurement terminal Vout1 and the second induction signal measurement terminal Vout2 will be equal to each other, and hence the pressure induction detection signals output by the first induction signal measurement terminal Vout1 and the second induction signal measurement terminal Vout2 will be 0, thereby simplifying the calculation press of the pressure value and improving the sensitivity of pressure detection.

It is found that, given the bias voltage input onto the pressure sensor 13 and in the case that the same location of the display panel is pressed by same force, the different included angle between the first edge of the pressure sensor 13 and the common boundary f between the display region 11 and the non-display region 12 corresponds to the different pressure induction detection signal output by the pressure sensor 13.

TABLE 1

| Location of the Pressure Sensor | | First-Type Pressure Sensor | Second-Type Pressure Sensor |
|---|---|---|---|
| Location A | Overlapped | 0.5 | 2.6 |
| | Partially Overlapped | 1 | 7 |
| | Not Overlapped | 1.2 | 7.8 |
| Location B | Overlapped | 0 | 0.05 |
| | Partially Overlapped | 0.15 | 0.2 |
| | Not Overlapped | 0.17 | 0.22 |

Figure 6:
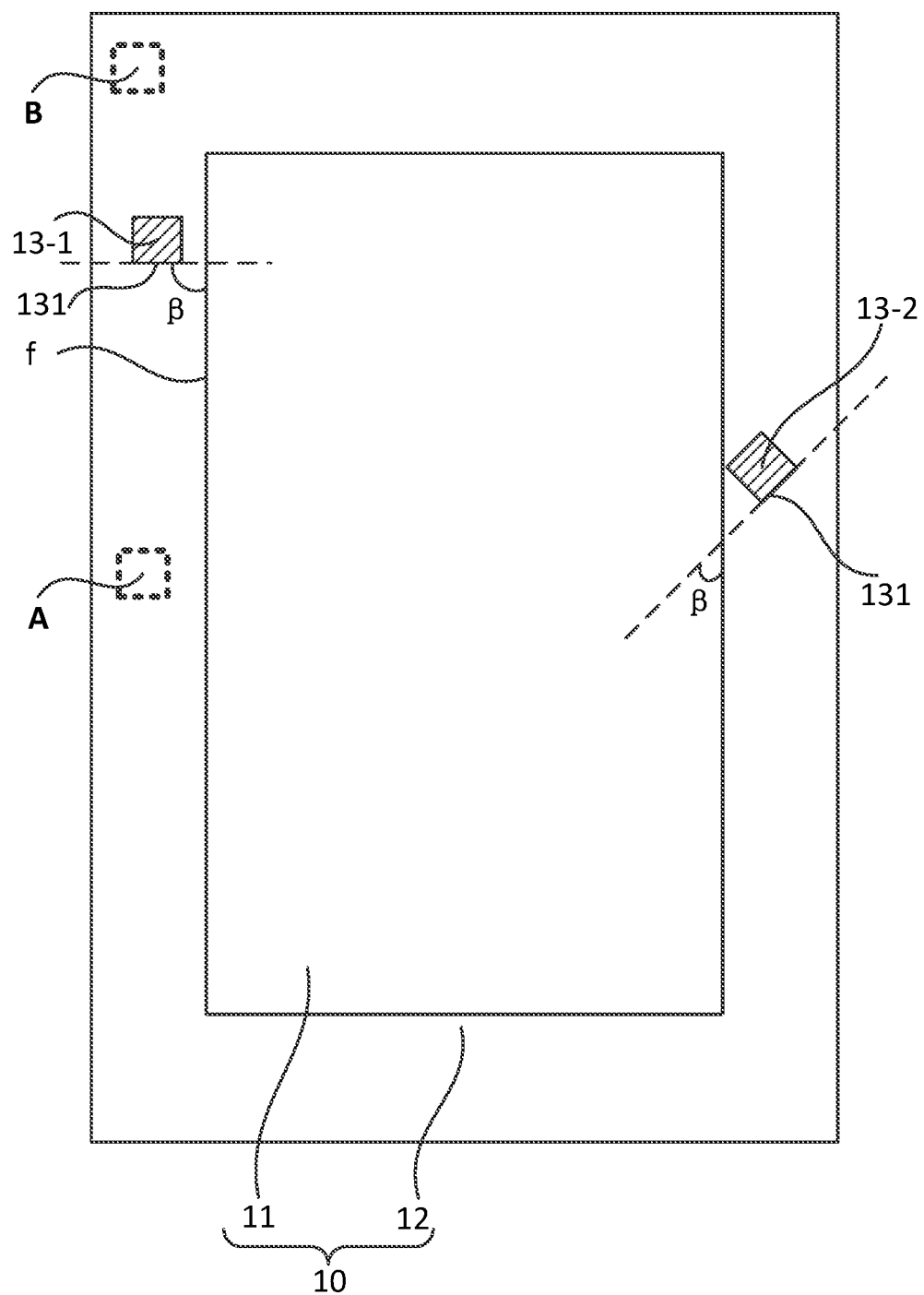
FIG. 6 is a structural representation of another display panel according to an embodiment of the disclosure.

FIG. 6 is a structural representation of another display panel according to an embodiment of the disclosure. Referring to FIG. 6, the pressure sensor shown in FIG. 4 may be provided at location A or location B in FIG. 6, the pressure induction detection signal output by the pressure sensor in the different situations is analyzed, and the result will be given in Table 1. The expression of "Partially Overlapped" refers to the case that the orthogonal projection of the sealant 30 on the first substrate 10 at least partially overlaps with the orthogonal projection of the pressure sensor 13 on the first substrate 10. The expression of "Not Overlapped" refers to the case that the orthogonal projection of the sealant 30 on the first substrate 10 does not overlap with the orthogonal projection of the pressure sensor 13 on the first substrate 10. The expression of "Overlapped" refers to the case that the orthogonal projection of the pressure sensor 13 on the first substrate 10 is located within the orthogonal projection of the sealant 30 on the first substrate 10. First-type pressure sensor 13-1 refers to a pressure sensor in which the included angle β between the first edge 131 and the common boundary f between the display region 11 and the non-display region 12 is 90°, and second-type pressure sensor 13-2 refers to a pressure sensor in which the included angle β between the first edge 131 and the common boundary f between the display region 11 and the non-display region 12 is 45°. Additionally, in Table 1, data are obtained, for example, based on the pressure induction detection signal as a comparison reference which is obtained in the case that the first-type pressure sensor 13-1 is provided at location A and is partially overlapped. Exemplarily, data "1.2" in the table represents that the pressure induction detection signal obtained in the case that the first-type pressure sensor 13-1 is provided at location A and is not overlapped is 1.2 times of the pressure induction detection signal obtained in the case that the first-type pressure sensor 13-1 is provided at location A and is partially overlapped.

Referring to Table 1, in general, the pressure induction detection signal output by the pressure sensor provided at location A is much larger than the pressure induction detection signal output by the pressure sensor provided at location B. For the location A, the difference between the magnitudes of the pressure induction detection signals output by the first-type pressure sensor 13-1 (or the second-type pressure sensor 13-2) in the case of partially overlapped and in the case of not overlapped is small, and the magnitude of the pressure induction detection signal output by the first-type pressure sensor 13-1 (or the second-type pressure sensor 13-2) in the case of partially overlapped is about two times of that of the pressure induction detection signal output in the case of overlapped. For the location B, the difference between the magnitudes of the pressure induction detection signals output by the first-type pressure sensor 13-1 (or the second-type pressure sensor 13-2) in the case of partially overlapped and in the case of not overlapped is small, and the pressure induction detection signal output by the first-type pressure sensor 13-1 (or the second-type pressure sensor 13-2) in the case of partially overlapped is much larger than the pressure induction detection signal output in the case of overlapped.

Based on the above, the included angle β between the first edge 131 of the pressure sensor 13 and the common boundary f between the display region 11 and the non-display region 12 may be 45°. The advantage of such an arrangement lies in that, the pressure induction detection signal output by the pressure sensor 13 may be improved, thereby improving the sensitivity and precision of pressure detection of the pressure sensor.

Figure 7:
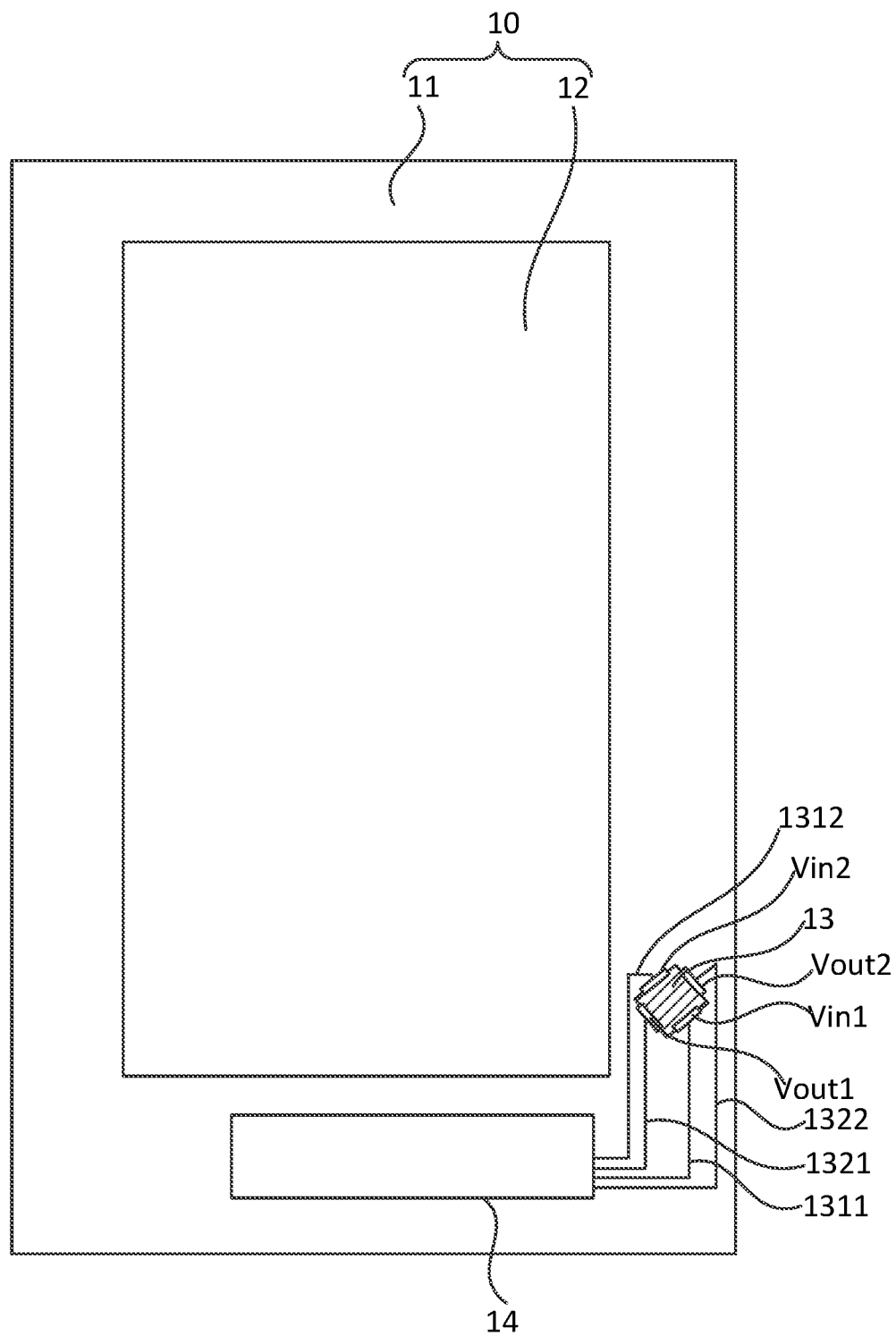
FIG. 7 is a structural representation of another display panel according to an embodiment of the disclosure.

FIG. 7 is a structural representation of another display panel according to an embodiment of the disclosure. Referring to FIG. 7, the display panel further includes a signal line and a drive chip 14. The signal line includes a first signal input line 1311, a second signal input line 1312, a first signal output line 1321 and a second signal output line 1322. The first power signal input terminal Vin1 is electrically connected with the drive chip 14 via the first signal input line 1311, the second power signal input terminal Vin2 is electrically connected with the drive chip 14 via the second signal input line 1312, the first induction signal measurement terminal Vout1 is electrically connected with the drive chip 14 via the first signal output line 1321, and the second induction signal measurement terminal Vout2 is electrically connected with the drive chip 14 via the second signal output line 1322.

In practical use, if the resistance value of the pressure sensor 13 is too small, even be comparable to the resistance value reaching the first signal input line 1311 and the second signal input line 1312. Because the first signal input line 1311 and the second signal input line 1312 may take away a part of the voltage, the magnitude of the voltage actually input onto the pressure sensor 13 will be very small. When the magnitude of the voltage input onto the pressure sensor 13 is too small, the pressure induction detection signal output by the pressure sensor 13 will be very small too, so that the pressure induction detection signal will fall into the noise signals, which will apparently lower the pressure detection sensitivity of the pressure sensor 13.

Figure 8:
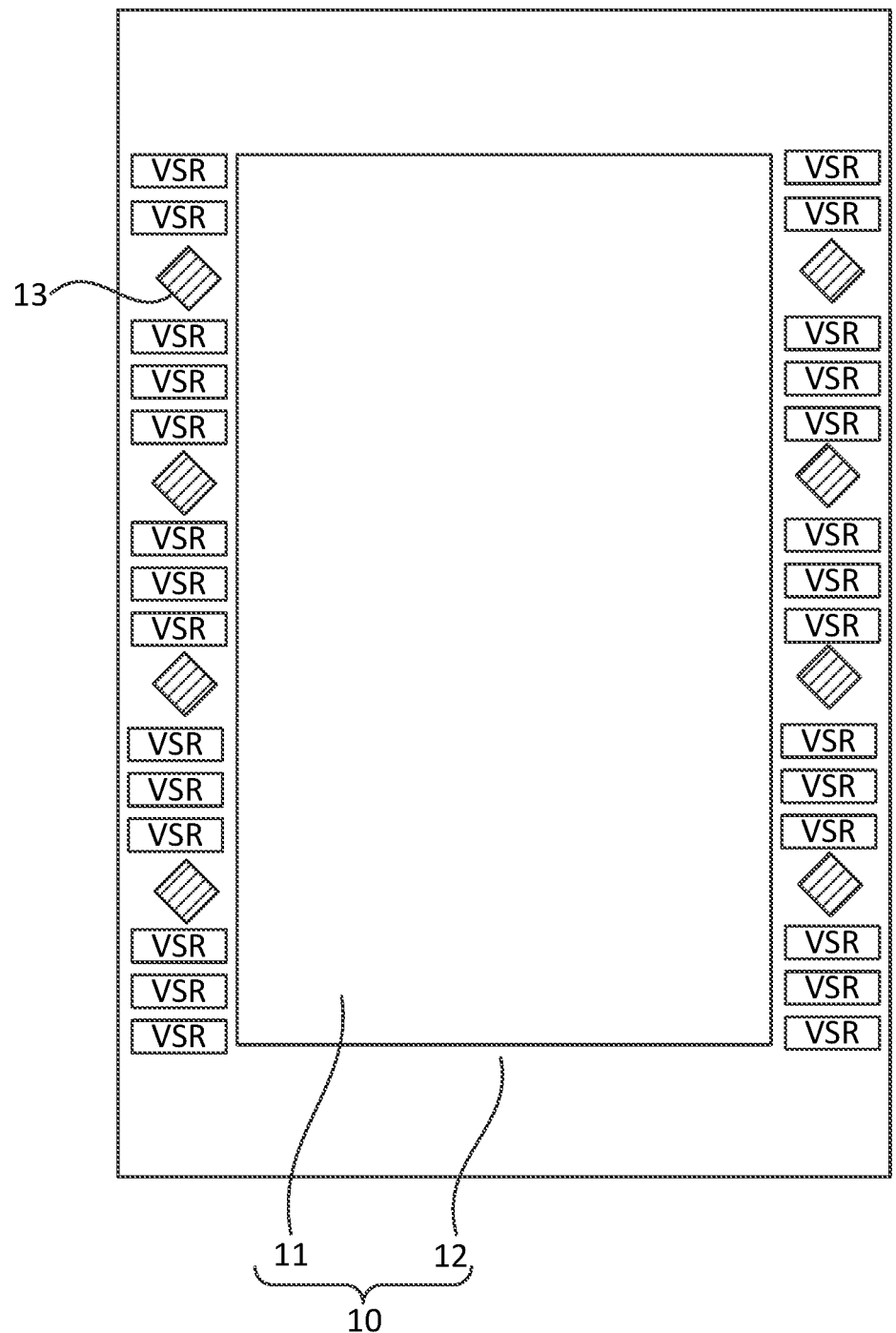
FIG. 8 is a structural representation of another display panel according to an embodiment of the disclosure.

FIG. 8 is a structural representation of another display panel according to an embodiment of the disclosure. In comparison with FIG. 7, the display panel 10 in FIG. 8 further includes a plurality of cascade shift registers VSR. Referring to FIG. 7, the shift register VSR is provided in the non-display region 12 of the display panel 10, and each shift register VSR corresponds to a scanning line located in the display region 11 (not shown in FIG. 8) to output a scanning signal to the scanning line.

For example, in a high-definition 5-inch rectangular display panel, the direction of a long side of its display region 11 is taken as the extension direction, and 500-1000 shift registers VSR generally need to be arrange respectively on both sides of the extension direction of the display region 11 of the display panel. With the development trend of narrow edge of the display panels, the size of the non-display region 12 of the display panel itself becomes small. In this case, since a large number of shift registers VSR need to be arranged, the region of the non-display region 12 available for arranging the pressure sensor 13 is narrow and small. If the size of the pressure sensor 13 is too large, interference may possibly occur between the signal transferred on the pressure sensor 13 and the signal transferred in the shift register VSR, thereby affecting the display effect and the pressure detection performance of the display panel.

In summary, the side length of the pressure sensor 13 may be larger than or equal to 20 nm and less than or equal to 300 nm. The advantage of such an arrangement lies in that, it may ensure that the pressure sensor 13 has an appropriate magnitude of resistance and a high pressure detection sensitivity without too much occupation on the area of the non-display region 12, and hence the display effect of the display panel will not be affected.

Figure 9:
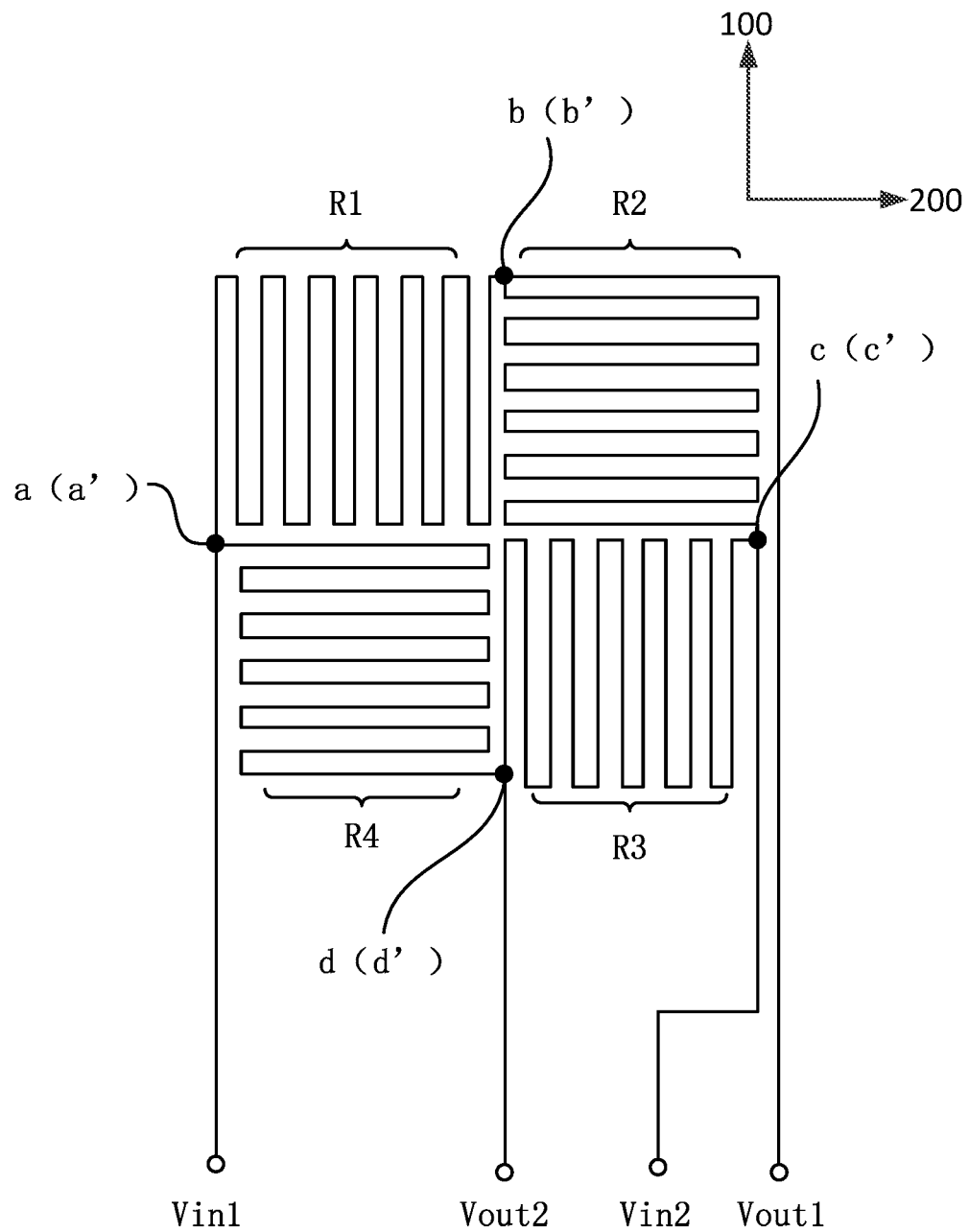
FIG. 9 is a structural representation of another pressure sensor according to an embodiment of the disclosure.

FIG. 9 is a structural representation of another pressure sensor according to an embodiment of the disclosure. Referring to FIG. 9, the pressure sensor includes a first inductive resistor R1, a second inductive resistor R2, a third inductive resistor R3 and a fourth inductive resistor R4; the first end a of the first inductive resistor R1 and the first end a' of the fourth inductive resistor R4 are electrically connected with the first power signal input terminal Vin1, the second end b of the first inductive resistor R4 and the first end b' of the second inductive resistor R2 are electrically connected with the first induction signal measurement terminal Vout1, the second end d of the fourth inductive resistor R4 and the first end d' of the third inductive resistor R3 are electrically connected with the second induction signal measurement terminal Vout2, and the second end c of the second inductive resistor R2 and the second end c' of the third inductive resistor R3 are electrically connected with the second power signal input terminal Vin2; the first power signal input terminal Vin1 and the second power signal input terminal Vin2 are configured to input a bias voltage signal to the pressure sensor; and the first induction signal measurement terminal Vout1 and the second induction signal measurement terminal Vout2 are configured to output a pressure induction signal from the pressure sensor.

Still referring to FIG. 9, the first inductive resistor R1, the second inductive resistor R2, the third inductive resistor R3 and the fourth inductive resistor R4 form a Wheatstone bridge structure. When a bias voltage signal is input to the first power signal input terminal Vin1 and the second power signal input terminal Vin2, an electric current will pass through each of the branches in the Wheatstone bridge. At this time, when the display panel is pressed, under the action of a shear force at the location on the display panel (including the first substrate 10 and the second substrate 20) corresponding to the pressure sensor 13, the impedance of each of the resistors (including the first inductive resistor R1, the second inductive resistor R2, the third inductive resistor R3 and the fourth inductive resistor R4) inside the pressure sensor 13 will change, so that the pressure induction detection signals output by the first induction signal measurement terminal Vout1 and the second induction signal measurement terminal Vout2 of the pressure sensor 13 will be different from the pressure induction detection signals output by the first induction signal measurement terminal Vout1 and the second induction signal measurement terminal Vout2 of the pressure sensor 13 without being pressed, and hence the magnitude of the touch pressure may be determined.

It needs to be noted that, because the Wheatstone bridge is provided on the display panel, when a pressure is applied to the display panel, the touch display panel will be deformed, and the first inductive resistor R1, the second inductive resistor R2, the third inductive resistor R3 and the fourth inductive resistor R4 provided on the display panel will all be deformed. In order to be enable detection of the magnitude of the touch pressure, the deformations sensed by the first inductive resistor R1, the second inductive resistor R2, the third inductive resistor R3 and the fourth inductive resistor R4 may be different from each other.

Referring to FIG. 9, may be the pressure sensor may further include a first extension direction 100 and a second extension direction 200, wherein the first extension direction 100 and the second extension direction 200 are crossed with each other; the component, in the first extension direction 100, of the extension length of the first inductive resistor R1 from the first end a to the second end b is larger than the component in the second extension direction 200; the component, in the second extension direction 200, of the extension length of the second inductive resistor R2 from the first end b' to the second end c is larger than the component in the first extension direction 100; the component, in the first extension direction 100, of the extension length of the third inductive resistor R3 from the first end d' to the second end c' is larger than the component in the second extension direction 200; and the component, in the second extension direction 200, of the extension length of the fourth inductive resistor R4 from the first end a' to the second end d is larger than the component in the first extension direction 100. By such an arrangement, the first inductive resistor R1 and the third inductive resistor R3 can sense the strain in the first extension direction 100, and the second inductive resistor R2 and the fourth inductive resistor R4 can sense the strain in the second extension direction 200. Because the strain induction direction of the first inductive resistor R1 is different from the strain induction direction of the second inductive resistor R2, and the strain induction direction of the fourth inductive resistor R4 is different from the strain induction direction of the third inductive resistor R3, the first inductive resistor R1 and the second inductive resistor R2, the third inductive resistor R3 and the fourth inductive resistor R4, may be arrange at the same spatial location or at locations with a similar distance, so that the first inductive resistor R1 and the second inductive resistor R2, and the third inductive resistor R3 and the fourth inductive resistor R4, may have a synchronous temperature variation, thereby eliminating the effect of temperature difference and improving the pressure induction precision.

Figure 10:
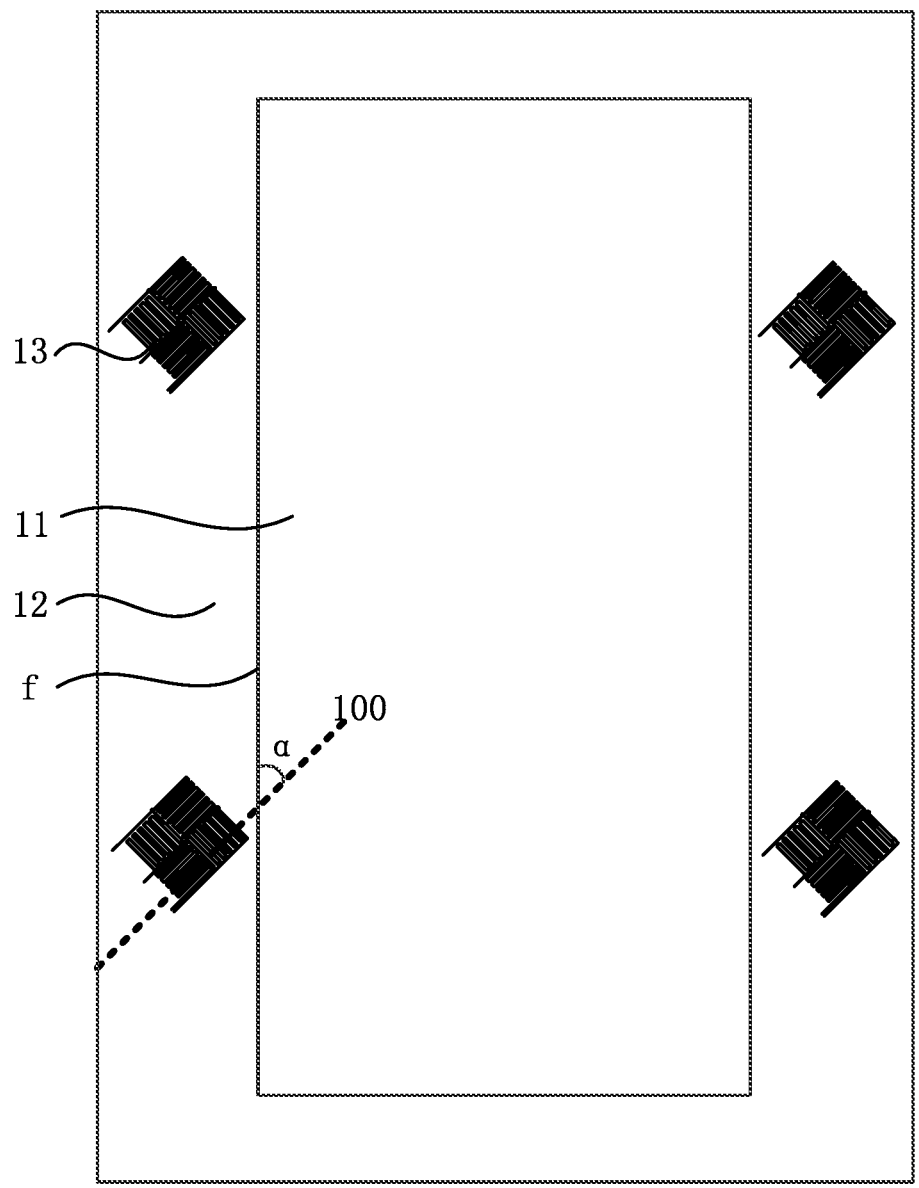
FIG. 10 is a structural representation of another display panel according to an embodiment of the disclosure.

Moreover, when a full-screen press test is carried on the display region 11 of the display panel, there is a region in which when any position thereof is pressed, the strain difference between the two directions detected by the pressure sensor 13 is very small or even is 0, so that the pressure sensor cannot detect the magnitude of the touch pressure in such the region. Such the region will be a detection blind area of the pressure sensor. In practical arrangement, the included angle between the first extension direction 100 of the pressure sensor and the common boundary f between the display region 11 and the non-display region 12 is different, and the specific location at which the detection blind area is present on the display panel is different. In one embodiment, the included angle α between the first extension direction 100 of the pressure sensor and the common boundary f between the display region 11 and the non-display region 12 is larger than or equal to 20° and less than or equal to 70°. The advantage of such an arrangement lies in that, the large touch blind area may be avoided to be present on the display panel. Moreover, as shown in FIG. 10, the included angle α between the first extension direction 100 of the pressure sensor and the common boundary f between the display region 11 and the non-display region 12 is set as 45°. The advantage of such an arrangement lies in that, the touch blind area of the display panel may be reduced to the maximum extent.

Figure 11:
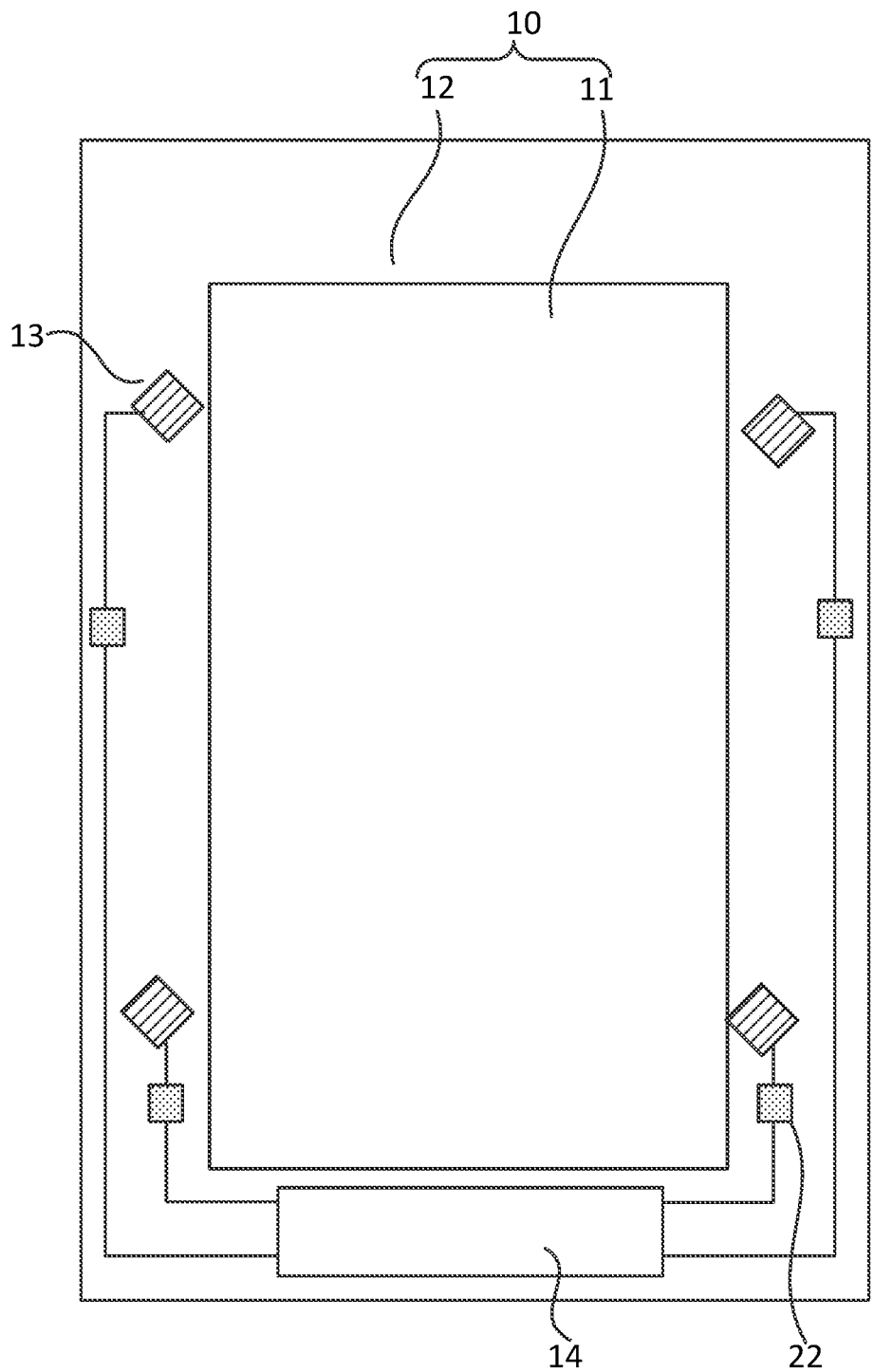
FIG. 11 is a structural representation of another display panel according to an embodiment of the disclosure.

FIG. 11 is a structural representation of another display panel according to an embodiment of the disclosure. On the basis of the above technical solutions, as shown in FIG. 11, the display panel further includes at least one control switch 22; the drive chip 14 is electrically connected with the control switch 22, the control switch 22 is electrically connected with the pressure sensor 13, and the drive chip 14 controls the working state of the pressure sensor by controlling the on or off of the control switch 22. Thus, the independence of each of pressure sensors 13 can be enhanced, so that the pressure sensors 13 will not be affected by each other, which is helpful for flexibly adjusting the working state of the pressure sensors 13 according to factors such as the touch location and the intensity of the pressure induction detection signal, etc., thereby lowering the power consumption of the display panel.

In some embodiments, in the pressure detection stage, according to the touch location, only parts of the pressure sensors 13 adjacent to the touch location may be turned on, and the pressure sensors 13 far away from the touch location may be turned off, so that the power consumption of the display panel during touch pressure detection may be lowered and the heat generated by the display panel during touch pressure detection may be reduced, thereby avoiding the affection on the performance of other functional film layers (for example, a functional film layer for image display) on the display panel due to the too high temperature at a regional area of the display panel, or even the malfunction of the display panel.

Specifically, there are various specific structures of the control switch 22, and detailed illustration will be given below on a typical example, but the disclosure will not be limited hereto.

Figure 12:
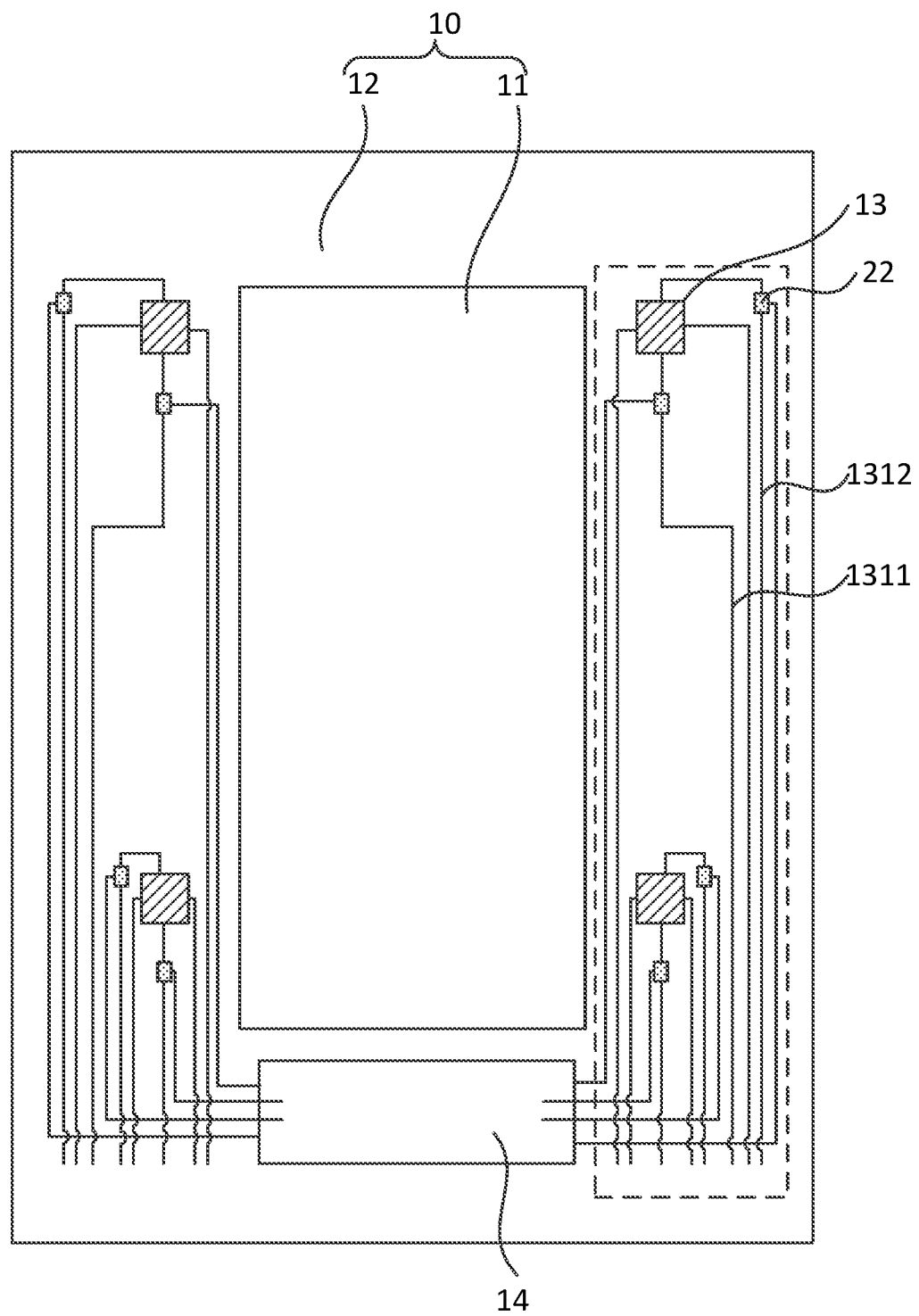
FIG. 12 is a structural representation of another display panel according to an embodiment of the disclosure.
Figure 13:
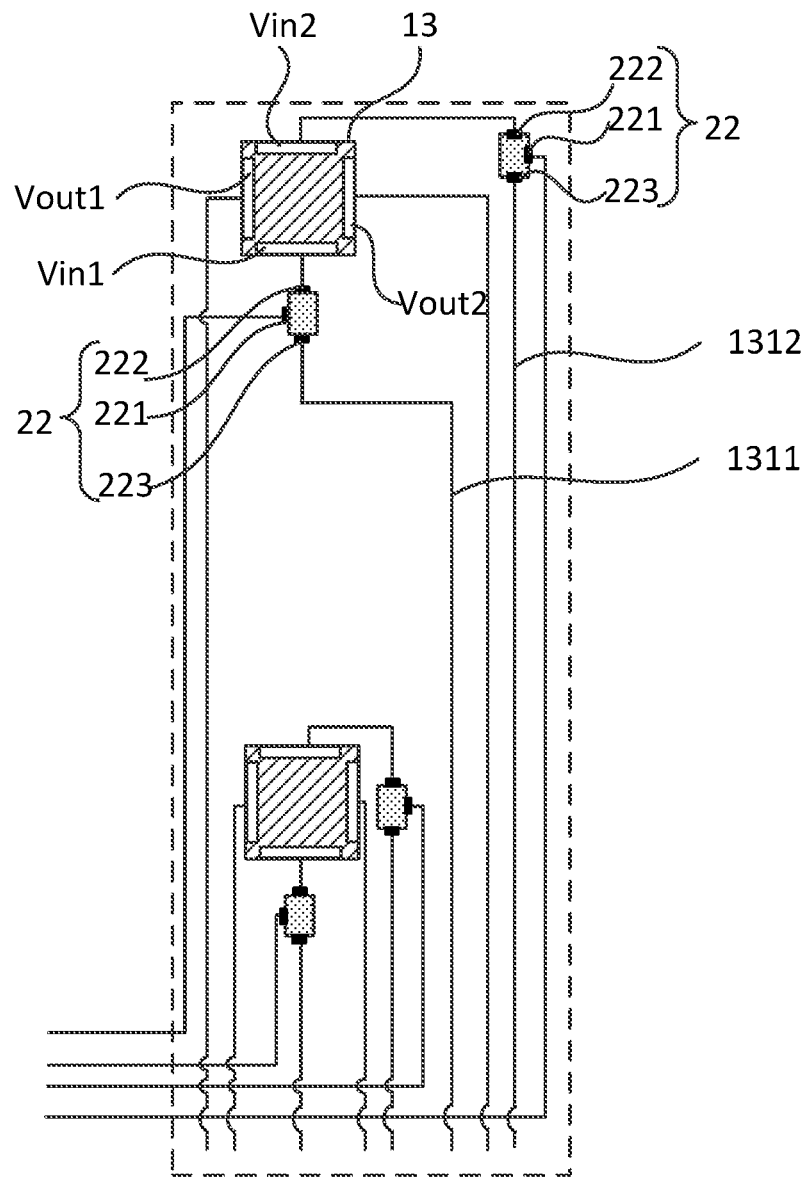
FIG. 13 is a close-up view of the dashed region in FIG. 12.

FIG. 12 is a structural representation of another display panel according to an embodiment of the disclosure, and FIG. 13 is a close-up view of the dashed region in FIG. 12. Referring to FIG. 13 and FIG. 12, the control switch 22 includes a control end 221, a first electrode 222 and a second electrode 223; the control end 221 is electrically connected with the drive chip 14 to control the on or off of the control switch 22; the first electrode 222 is electrically connected with the first power signal input terminal Vin1 of the pressure sensor 13, and the second electrode 223 is electrically connected with the first signal input line 1311; or, the first electrode 222 is electrically connected with the second power signal input terminal Vin2 of the pressure sensor 13, and the second electrode 223 is electrically connected with the second signal input line 1312. The advantage of such an arrangement lies in that, the working state of each of the pressure sensors 13 can be targeted to be controlled according to factors such as the touch location and the intensity of the pressure induction detection signal, etc., so that in the touch pressure detection stage, only a part of the pressure sensors 13 on the display panel are in a on state, thereby lowering the power consumption and reducing the heat dissipation.

Figure 14:
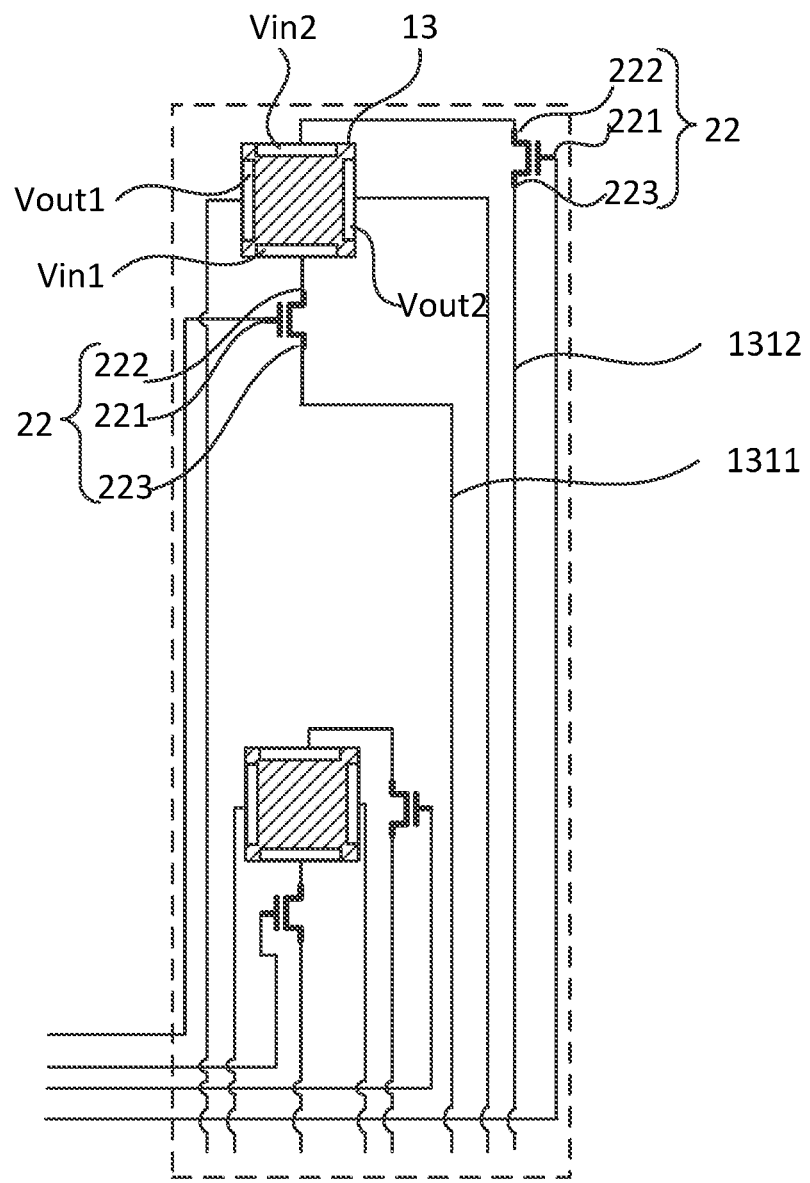
FIG. 14 is a partial structural representation of another display panel according to an embodiment of the disclosure.

FIG. 14 is a partial structural representation of another display panel according to an embodiment of the disclosure. Moreover, referring to FIG. 14, the control switch 22 may include a thin-film transistor, which includes a source electrode, a drain electrode and a gate electrode; the source electrode is the second electrode 223 of the control switch 22, the drain electrode is the first electrode 222 of the control switch 22, and the gate electrode is the control end 221 of the control switch 22. The advantage of using a thin-film transistor as a control switch lies in that the structure is relatively simple and the area of the non-display region 12 needed for manufacturing the thin-film transistor is relatively small, thereby conforming to the development trend of narrow frame. Additionally, the display panel often includes a plurality of thin-film transistors configured to control the working states of the pixel units and a plurality of thin-film transistors integrated in the shift registers and configured to generate scanning signals. In one embodiment, the thin-film transistor functioning as a control switch is manufactured together with the thin-film transistors configured to control the working states of pixel units or the thin-film transistors configured to generate scanning signals, so that the manufacture process may be saved, thereby simplifying the manufacture technique, and lowering the production cost.

Figure 15:
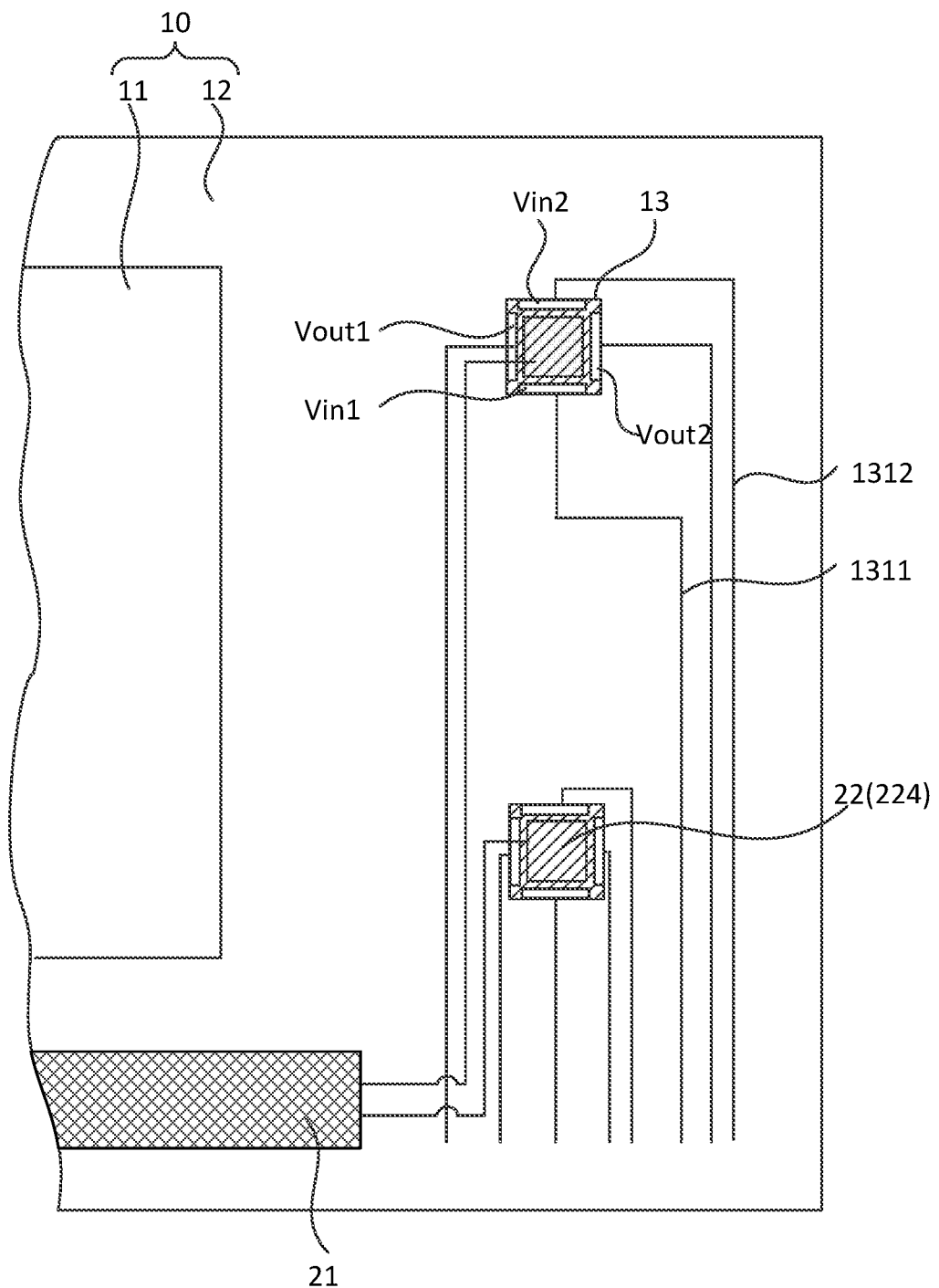
FIG. 15 is a partial structural representation of another display panel according to an embodiment of the disclosure.

FIG. 15 is a partial structural representation of another display panel according to an embodiment of the disclosure. As different from the display panel shown in FIG. 12 and FIG. 13, the control switch 22 in FIG. 15 includes a control electrode 224. Referring to FIG. 15, the vertical projection of the control electrode 224 on the substrate 10 at least partially overlaps with the vertical projection of the pressure sensor 13 on the substrate 10, and the control electrode 224 is insulated from the pressure sensor 13 and is electrically connected with the drive chip 14. Then, the control electrode 224 is equivalent to the gate electrode of the thin-film transistor, and the region of the pressure sensor 13 overlapping with the vertical projection of the control electrode 224 on the pressure sensor 13 is equivalent to the channel region of the thin-film transistor. When the voltage on the control electrode 224 is increased to a certain extent, the channel region may be turned on, and hence the pressure sensor 13 will be in a normal working state; otherwise, the pressure sensor 13 will be in an off state. Because the vertical projection of the control electrode 224 functioning as the control switch 22 on the substrate 10 at least partially overlaps with the vertical projection of the pressure sensor 13 on the substrate 10, the control electrode 224 overlaps with the pressure sensor 13 when viewing in a direction vertical to the display panel, and hence no area of the non-display region 12 is occupied, thereby conforming to the development trend of narrow frame.

Figure 16:
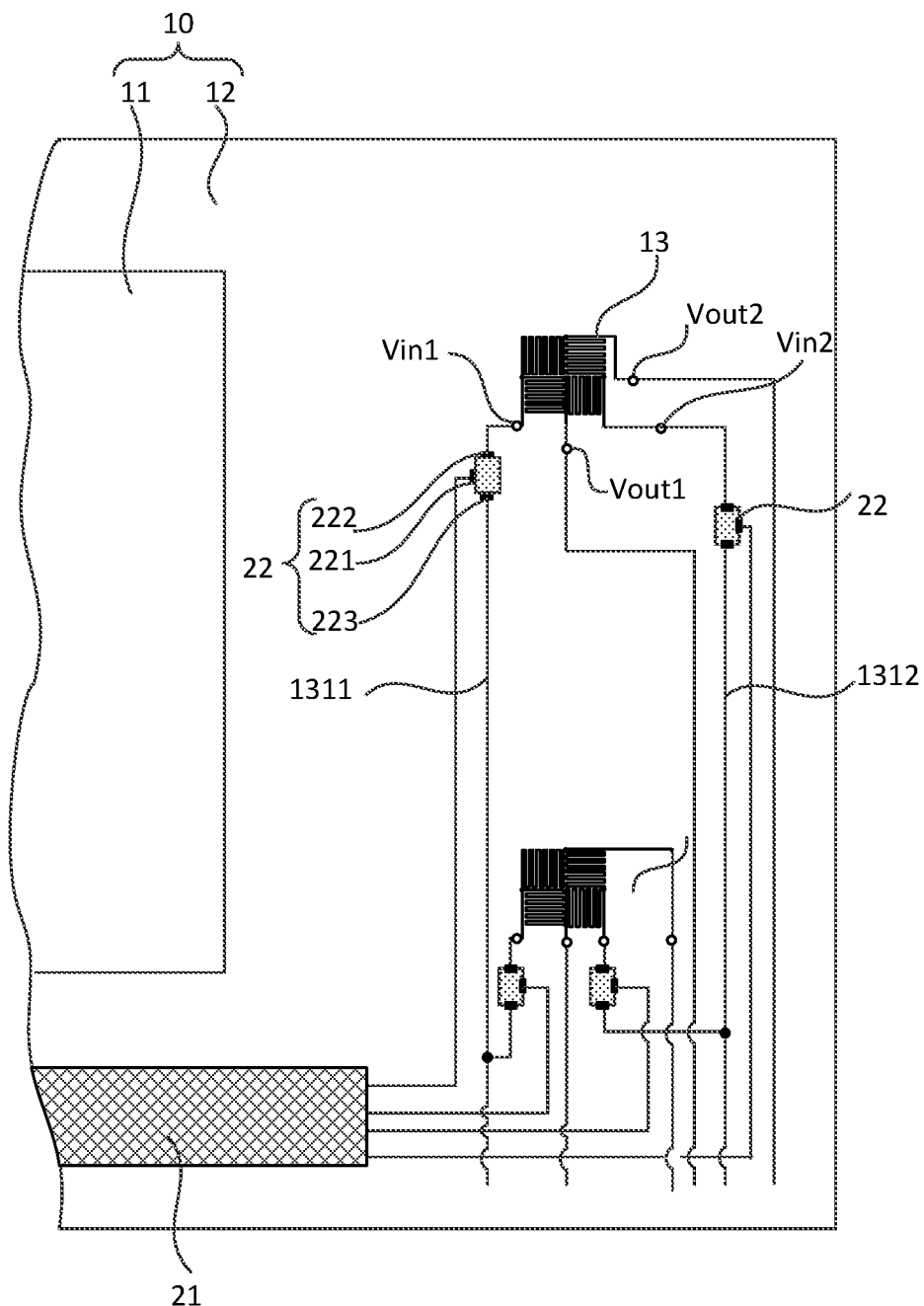
FIG. 16 is a partial structural representation of another display panel according to an embodiment of the disclosure.

Moreover, FIG. 16 is a partial structural representation of another display panel according to an embodiment of the disclosure. Referring to FIG. 16, on the basis of the above technical solutions, the first power signal input terminal Vin1 of each of pressure sensors 13 on the same side of the display region 11 may be connected with the same first signal input line 1311 via the control switch 22; and the second power signal input terminal Vin2 of each of the pressure sensors 13 on the same side of the display region 11 is connected with the same second signal input line 1312 via the control switch 22. The advantage of such an arrangement lies in that, there is no need to provide the first signal input line 1311 or the second signal input line 1312 for each of the pressure sensors 13. The bias voltage can be input to all the pressure sensors 13 on a side by only providing one first signal input line 1311 and one second signal input line 1312 on the same side of the display region 11, so that the number of the first signal input lines 1311 and the second signal input lines 1312 arranged may be reduced effectively, without too much occupation on wiring space of the non-display region, thereby conforming to the development trend of narrow frame.

Figure 17:
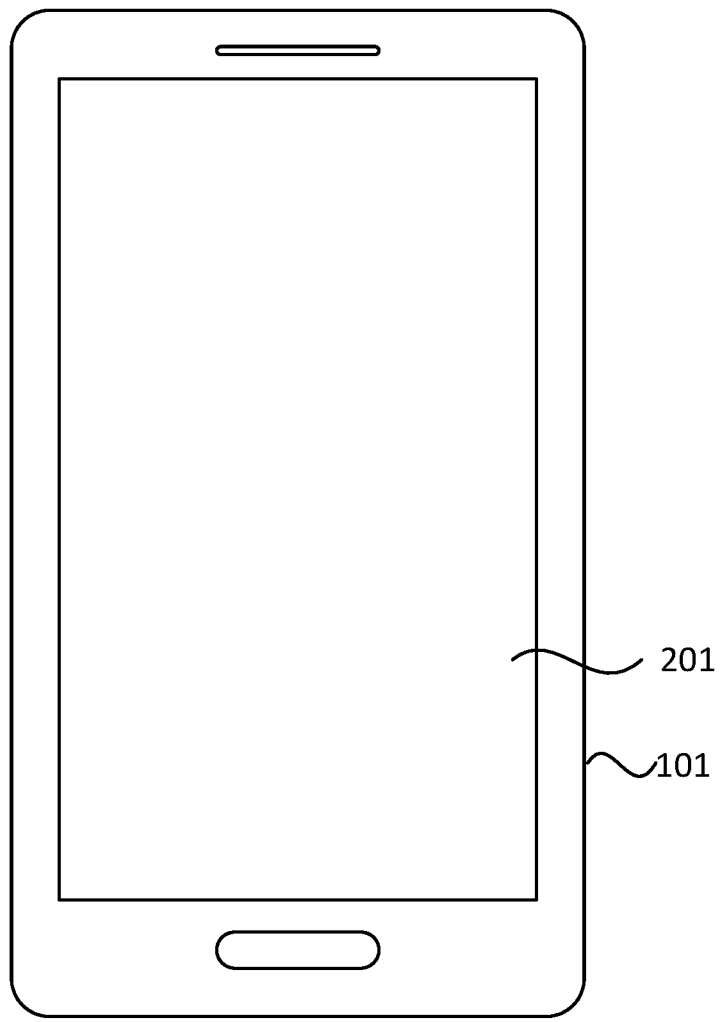
FIG. 17 is a structural representation of a display device according to an embodiment of the disclosure.

An embodiment of the disclosure further provides a display device. FIG. 17 is a structural representation of the display device according to the embodiment of the disclosure. Referring to FIG. 17, the display device 101 includes any display panel 201 according to the embodiments of the disclosure, and the display device 101 may be a mobile phone, a tablet computer and an intelligent wearable apparatus, etc.

In the display device according to the embodiment of the disclosure, the distance from a midline of the sealant to a common boundary between the display region and the non-display region is larger than the distance from a geometric center of the pressure sensor to the common boundary between the display region and the non-display region, so that the problem in the existing display panel that the pressure detection performance of the pressure sensor is not good due to the unreasonable relative locations of the sealant and the pressure sensor may be solved, thereby improving the pressure detection performance of the display panel.

It should be noted that the embodiments of the present invention and the technical principles used therein are described as above. It will be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. A display panel, comprising;
   a first substrate, which comprises a display region and a non-display region surrounding the display region;
   a second substrate arranged opposite to the first substrate; and
   a pressure sensor, which is located within the non-display region of the first substrate and located on one side of the first substrate that is proximate to the second substrate;
   wherein the first substrate and the second substrate are adhered to each other via a sealant, an orthogonal projection of the sealant on the first substrate is located within the non-display region of the first substrate, and a distance from a midline of the sealant to a common boundary between the display region and the non-display region is larger than a distance from a geometric center of the pressure sensor to the common boundary between the display region and the non-display region, wherein the midline of the sealant is a perpendicular bisector of a common perpendicular line of two edges of the sealant;
   wherein an orthogonal projection of the sealant on the first substrate partially overlaps with an orthogonal projection of the pressure sensor on the first substrate;
   wherein an overlapping area between the orthogonal projection of the sealant and the orthogonal projection of the pressure sensor is less than or equal to half of a total area of the orthogonal projection of pressure sensor.

2. The display panel as claimed in claim 1, wherein the pressure sensor is in a form of a quadrangle and made of a semiconductor material, and comprises a first edge, a second edge, a third edge and a fourth edge, wherein the first edge and the second edge are arranged opposite to each other, and the third edge and the fourth edge are arranged opposite to each other;
   the pressure sensor comprises a first power signal input terminal located on the first edge and a second power signal input terminal located on the second edge, for inputting a bias voltage signal to the pressure sensor; and
   the pressure sensor further comprises a first induction signal measurement terminal located on the third edge and a second induction signal measurement terminal located on the fourth edge, for outputting a pressure induction detection signal from the pressure sensor.

3. The display panel as claimed in claim 2, wherein a shape of the pressure sensor is a square.

4. The display panel as claimed in claim 3, wherein an included angle between the first edge of the pressure sensor and the common boundary between the display region and the non-display region is 45°.

5. The display panel as claimed in claim 3, wherein a length of the edge of the pressure sensor is larger than or equal to 20 nm and is less than or equal to 300 nm.

6. The display panel as claimed in claim 1, wherein the pressure sensor comprises an first inductive resistor, a second inductive resistor, a third inductive resistor and a fourth inductive resistor; wherein
   a first end of the first inductive resistor and a first end of the fourth inductive resistor are electrically connected with a first power signal input terminal, a second end of the first inductive resistor and a first end of the second inductive resistor is electrically connected with a first induction signal measurement terminal, a second end of the fourth inductive resistor and a first end of the third inductive resistor is electrically connected with a second induction signal measurement terminal, and a second end of the second inductive resistor and a second end of the third inductive resistor is electrically connected with a second power signal input terminal;
   the first power signal input terminal and the second power signal input terminal are configured to input a bias voltage signal to the pressure sensor, and the first induction signal measurement terminal and the second induction signal measurement terminal are configured to output a pressure induction detection signal from the pressure sensor.

7. The display panel as claimed in claim 6, wherein:
   the pressure sensor further comprises a first extension direction and a second extension direction, and the first extension direction and the second extension direction are crossed with each other; wherein
   a component, in the first extension direction, of an extension length of the first inductive resistor from the first end to the second end is larger than a component thereof in the second extension direction,
   a component, in the second extension direction, of an extension length of the second inductive resistor from the first end to the second end is larger than a component thereof in the first extension direction,
   a component, in the first extension direction, of an extension length of the third inductive resistor from the first end to the second end is larger than a component thereof in the second extension direction, and
   a component, in the second extension direction, of an extension length of the fourth inductive resistor from the first end to the second end is larger than a component thereof in the first extension direction.

8. The display panel as claimed in claim 7, further comprising:
   an included angle between the first extension direction of the pressure sensor and the common boundary between the display region and the non-display region is 45°.

9. A display device, comprising a display panel which comprises;
   a first substrate, which comprises a display region and a non-display region surrounding the display region;
   a second substrate arranged opposite to the first substrate; and
   a pressure sensor, which is located within the non-display region of the first substrate and located on one side of the first substrate that is proximate to the second substrate;
   wherein the first substrate and the second substrate are adhered to each other via a sealant, an orthogonal projection of the sealant on the first substrate is located within the non-display region of the first substrate, and a distance from a midline of the sealant to a common boundary between the display region and the non-display region is larger than a distance from a geometric center of the pressure sensor to the common boundary between the display region and the non-display region, wherein the midline of the sealant is a perpendicular bisector of a common perpendicular line of two edges of the sealant;
   wherein an orthogonal projection of the sealant on the first substrate partially overlaps with an orthogonal projection of the pressure sensor on the first substrate;
   wherein an overlapping area between the orthogonal projection of the sealant and the orthogonal projection of the pressure sensor is less than or equal to half of a total area of the orthogonal projection of pressure sensor.

\* \* \* \* \*